(12) United States Patent
Zeng et al.

(10) Patent No.: US 12,144,227 B2
(45) Date of Patent: Nov. 12, 2024

(54) DISPLAY PANEL AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yang Zeng, Beijing (CN); Fuqiang Yang, Beijing (CN); Yu Wang, Beijing (CN); Yuanqi Zhang, Beijing (CN); Ping Wen, Beijing (CN); Shun Zhang, Beijing (CN); Chang Luo, Beijing (CN); Wei Wang, Beijing (CN); Tianci Chen, Beijing (CN); Yi Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/778,887

(22) PCT Filed: Jul. 6, 2021

(86) PCT No.: PCT/CN2021/104691
§ 371 (c)(1),
(2) Date: May 23, 2022

(87) PCT Pub. No.: WO2023/279255
PCT Pub. Date: Jan. 12, 2023

(65) Prior Publication Data
US 2024/0172517 A1 May 23, 2024

(51) Int. Cl.
H10K 59/40 (2023.01)
G06F 3/044 (2006.01)
(Continued)

(52) U.S. Cl.
CPC .......... H10K 59/40 (2023.02); G06F 3/0446 (2019.05); H10K 59/122 (2023.02);
(Continued)

(58) Field of Classification Search
CPC .... H10K 59/40; H10K 59/122; H10K 59/873; H10K 50/844; H10K 59/131;
(Continued)

(56) References Cited

U.S. PATENT DOCUMENTS

2018/0196551 A1* 7/2018 Park .................... G06F 3/0446
2019/0165311 A1* 5/2019 Lee ....................... H10K 50/84

FOREIGN PATENT DOCUMENTS

| CN | 111341826 A | * | 6/2020 | ......... H01L 27/3244 |
| CN | 112181204 A | * | 1/2021 | ........... G06F 3/0412 |

(Continued)

*Primary Examiner* — Ricardo Osorio
(74) *Attorney, Agent, or Firm* — Dority & Manning, P.A.

(57) ABSTRACT

A display panel includes: a display substrate, a first barrier wall surrounding a display area, a blocking portion between the first barrier wall and the display area, a first encapsulation layer covering at least the display area, and touch wires. The blocking portion at least partially surrounds the display area. The first encapsulation layer includes a first surface, a second surface and a transition surface connecting the surfaces. On the display substrate, orthographic projections of the touch wires at least partially overlap with an orthographic projection on of the second surface, and are staggered with an orthographic projection of the transition surface; and at least a portion of the orthographic projection of the transition surface is located in a region between a border, away from the display area, of an orthographic projection of the blocking portion and an orthographic projection of a touch wire farthest away from the display area.

20 Claims, 14 Drawing Sheets

(51) Int. Cl.
  *H10K 59/122*  (2023.01)
  *H10K 59/80*   (2023.01)
(52) U.S. Cl.
  CPC . *H10K 59/873* (2023.02); *G06F 2203/04107* (2013.01); *G06F 2203/04111* (2013.01)
(58) Field of Classification Search
  CPC ......... G06F 3/0446; G06F 2203/04107; G06F 2203/04111; G06F 3/0412; G06F 3/041; G06F 3/04164; G06F 3/044
  See application file for complete search history.

(56) References Cited

FOREIGN PATENT DOCUMENTS

| | | | | |
|---|---|---|---|---|
| CN | 107275508 B | * | 9/2021 | ......... G02F 1/13452 |
| WO | WO-2019148886 A1 | * | 8/2019 | ......... H01L 27/1214 |

* cited by examiner

DISPLAY PANEL AND DISPLAY APPARATUS

CROSS-REFERENCE TO RELATED APPLICATION

This application is a national phase entry under 35 USC 371 of International Patent Application No. PCT/CN2021/104691 filed on Jul. 6, 2021, which is incorporated herein by reference in its entirety.

TECHNICAL FIELD

The present disclosure relates to the field of display technologies, and in particular, to a display panel and a display apparatus.

BACKGROUND

On cell technologies (an integration of touch and display technologies) have gradually attracted people's attention with development of active matrix organic light-emitting diode (AMOLED) display apparatuses toward a direction of thinness and lightness.

The on cell technologies refer to technologies in which a touch functional layer is disposed on a display side of a display panel. In some technologies, the touch function layer may be formed directly on a thin film encapsulation (TFE) layer of a display substrate by adopting a photolithographic process. The touch functional layer includes touch units and peripheral wires (traces), each touch unit is electrically connected to at least one peripheral wire, so that a sensing signal is transmitted to the touch unit through the peripheral wire.

SUMMARY

In an aspect, a display panel is provided. The display panel having a display area, includes a display substrate, a first barrier wall, a blocking portion, a first encapsulation layer and a plurality of touch wires. The first barrier wall is disposed on a display side of the display substrate and surrounds the display area. The blocking portion is disposed between the first barrier wall and the display area, and at least partially surrounds the display area. The first encapsulation layer covers at least the display area. The first encapsulation layer includes a first surface proximate to the display substrate, a second surface away from the display substrate, and a transition surface connecting the first surface and the second surface. The plurality of touch wires are disposed on a side of the first encapsulation layer away from the display substrate. Orthographic projections of the plurality of touch wires on the display substrate at least partially overlap with an orthographic projection of the second surface on the display substrate, and are staggered with an orthographic projection of the transition surface on the display substrate. At least a portion of the orthographic projection of the transition surface on the display substrate is located in a region between a border, away from the display area, of an orthographic projection of the blocking portion on the display substrate and an orthographic projection of a touch wire farthest away from the display area among the plurality of touch wires on the display substrate.

In some embodiments, at least a portion of a border, proximate to the display area, of the orthographic projection of the blocking portion on the display substrate is located within a range of the orthographic projection of the transition surface on the display substrate. At least a portion of a border of an orthographic projection of the first surface on the display substrate is located within a region between the border, proximate to the display area, of the orthographic projection of the blocking portion on the display substrate and the orthographic projection of the touch wire farthest away from the display area among the plurality of touch wires on the display substrate. At least a portion of a border of the orthographic projection of the second surface on the display substrate is located within a region between the border, proximate to the display area, of the orthographic projection of the blocking portion on the display substrate and the border, away from the display area, of the orthographic projection of the blocking portion on the display substrate.

In some embodiments, an edge portion of the blocking portion proximate to the display area includes a slope surface, and an edge portion of the first encapsulation layer proximate to the blocking portion climbs along the slope surface.

In some embodiments, the transition surface is an arc-shaped surface, and a shape of the arc-shaped surface is adapted to a shape of the slope surface.

In some embodiments, at least a portion of a border of an orthographic projection of the first surface on the display substrate, and at least a portion of a border of the orthographic projection of the second surface on the display substrate are both located within a region between a border, proximate to the display area, of the orthographic projection of the blocking portion on the display substrate and the orthographic projection of the touch wire farthest away from the display area among the plurality of touch wires on the display substrate.

In some embodiments, the transition surface is substantially perpendicular to a plane where the display substrate is located. Or the transition surface is an arc-shaped surface bent toward an inside of the first encapsulation layer.

In some embodiments, the display substrate includes a substrate and at least one planarization layer disposed on the substrate. The display substrate has a groove located between the blocking portion and the display area. The groove at least partially surrounds the display area, and the groove at least partially penetrates the at least one planarization layer in a thickness direction of the display substrate. An orthographic projection of at least one touch wire among the plurality of touch wires on the display substrate at least partially overlaps with a region where the groove is located.

In some embodiments, the at least one planarization layer includes a first planarization layer and a second planarization layer. The first planarization layer is disposed on the substrate, and the second planarization layer is disposed on a side of the first planarization layer away from the substrate. The groove at least partially penetrates at least one of the first planarization layer or the second planarization layer.

In some embodiments, the first encapsulation layer includes a filling portion filling the groove and a covering portion located in at least a portion of a region of the display substrate other than the groove. A surface of the filling portion away from the display substrate is substantially coplanar with a surface of the covering portion away from the display substrate.

In some embodiments, the display panel further has a peripheral area surrounding the display area. The peripheral area includes a touch lead region located on a side of the display area. The first barrier wall, the blocking portion and the plurality of touch wires are disposed in the peripheral area, and a portion of the blocking portion located in the touch lead region has an opening.

In some embodiments, the opening is funnel-shaped. In the funnel-shaped opening, an end with a large size is proximate to the display area, and an end with a small size is proximate to a portion of the first barrier wall located in the touch lead region.

In some embodiments, the blocking portion includes a main body portion and two edges. The main body portion is located in a region of the peripheral area other than the touch lead region. At least a portion of each edge is located in the touch lead region. The two edges are respectively located on opposite sides of a center line of the display substrate extending in a first direction, and are respectively connected to both ends of the main body portion. The opening is formed between the two edges. The first direction is a direction substantially perpendicular to a boundary line between the display area and the touch lead region.

In some embodiments, each edge includes a connection section and a guide section. Of the connection section, one end is connected to the main body portion, and another end is connected to the guide section. In the two edges, a distance between ends of the two guide sections proximate to the connection sections is greater than a distance between ends of the two guide sections away from the connection sections.

In some embodiments, the connection section and the guide section have a circular arc transition therebetween.

In some embodiments, the guide section and the portion of the first barrier wall located in the touch lead region have a gap therebetween.

In some embodiments, a ratio of a maximum dimension of the opening in a second direction to a maximum dimension of the portion of the first barrier wall located in the touch lead region in the second direction is greater than or equal to 0.5, and less than 1. The second direction is a direction substantially parallel to the boundary line between the display area and the touch lead region.

In some embodiments, the display panel further includes a second encapsulation layer. The second encapsulation layer is disposed between the display substrate and the first encapsulation layer, and covers at least the display area, the blocking portion and the first barrier wall. A surface, away from the display substrate, of a portion of the second encapsulation layer covering the blocking portion is substantially coplanar with the second surface of the first encapsulation layer.

In some embodiments, the display substrate includes a substrate and a plurality of first insulating layers stacked on the substrate. The plurality of first insulating layers include at least one of a gate insulating layer, an interlayer dielectric layer, a passivation layer, a first planarization layer, a second planarization layer, a pixel defining layer or a support layer. The blocking portion and the first barrier wall each includes a single sub-layer or a plurality of sub-layers that are stacked, and at least one sub-layer is located in at least one layer among the plurality of first insulating layers.

In some embodiments, a maximum height of the blocking portion is substantially equal to a maximum height of the first barrier wall.

In some embodiments, the display panel further includes a second barrier wall. The second barrier wall is disposed on a side of the first barrier wall away from the display area, and surrounds the display area. The second barrier wall includes another single sub-layer or another plurality of sub-layers that are stacked, and at least one sub-layer of the second barrier wall is located in the at least one layer or located in another at least one layer among the plurality of first insulating layers. A maximum height of the second barrier wall is greater than a maximum height of the first barrier wall.

In some embodiments, the display panel further has a peripheral area surrounding the display area. The peripheral area includes a touch lead region located on a side of the display area. The first barrier wall, the blocking portion and the plurality of touch wires are disposed in the peripheral area. In a region of the peripheral area other than the touch lead region, in a direction of a plane where the display substrate is located, a ratio of a distance between the blocking portion and the first barrier wall to a distance between the blocking portion and the touch wire farthest away from the display area among the plurality of touch wires is less than or equal to 3.

In some embodiments, the distance between the blocking portion and the touch wire farthest away from the display area among the plurality of touch wires is in a range of 40 μm to 60 μm, inclusive. And/or, the distance between the blocking portion and the first barrier wall is in a range of 140 μm to 160 μm, inclusive.

In some embodiments, the display panel further includes a touch functional layer, and the touch functional layer is disposed on the display substrate. The touch functional layer includes an electrode layer, a second insulating layer, and a bridge layer that are stacked on the display substrate, the second insulating layer is located between the electrode layer and the bridge layer, and the bridge layer is located on a side of the electrode layer proximate to or away from the display substrate. The electrode layer and the bridge layer are divided into at least a plurality of first touch units and a plurality of second touch units. Each first touch unit extends in a first direction, and the plurality of first touch units are arranged side by side in a second direction; each second touch unit extends in the second direction, and the plurality of second touch units are arranged side by side in the first direction, the first direction crosses the second direction. Each of the pluralities of first touch units and second touch units is electrically connected to at least one touch wire. The first touch unit includes a plurality of first touch electrodes and a plurality of first connection portions, and two adjacent first touch electrodes are electrically connected through a first connection portion therebetween. A second touch unit includes a plurality of second touch electrodes and a plurality of second connection portions, and two adjacent second touch electrodes are electrically connected through a second connection portion therebetween.

The first touch electrodes, the first connection portions and second touch electrodes are disposed in the electrode layer, and the second connection portions are disposed in the bridge layer. Or the first touch electrodes, the second touch electrodes and the second connection portions are disposed in the electrode layer, and the first connection portions are disposed in the bridge layer.

In some embodiments, at least one touch wire among the plurality of touch wires includes a first touch sub-wire disposed in the electrode layer and a second touch sub-wire disposed in the bridge layer, and the first touch sub-wire is electrically connected to the second touch sub-wire through at least one via hole in the second insulating layer.

In some embodiments, the first touch electrodes and the second touch electrodes are each of a metal mesh structure.

In some embodiments, the display panel further includes at least one shielding wire located on a side of the plurality of touch wires away from the display area, an orthographic projection of the shielding wire on the display substrate is non-overlapping with the orthographic projection of the blocking portion on the display substrate, and the orthographic projection of the shielding wire on the display substrate is located in a region between the orthographic projection of the transition surface on the display substrate and the orthographic projection of the touch wire farthest from the display area among the plurality of touch wires on the display substrate.

In some embodiments, a minimum thickness of the first encapsulation layer at an overlapping position of the touch wire farthest away from the display area among the plurality of touch wires and the first encapsulation layer is greater than or equal to a maximum thickness of the first encapsulation layer at an overlapping position of the shielding wire and the first encapsulation layer.

In some embodiments, a ratio of a difference between the minimum thickness and the maximum thickness to the minimum thickness is within 30%.

In another aspect, a display apparatus is provided. The display apparatus includes the display panel according to any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and actual timings of signals to which the embodiments of the present disclosure relate.

DETAILED DESCRIPTION

Figure 1:
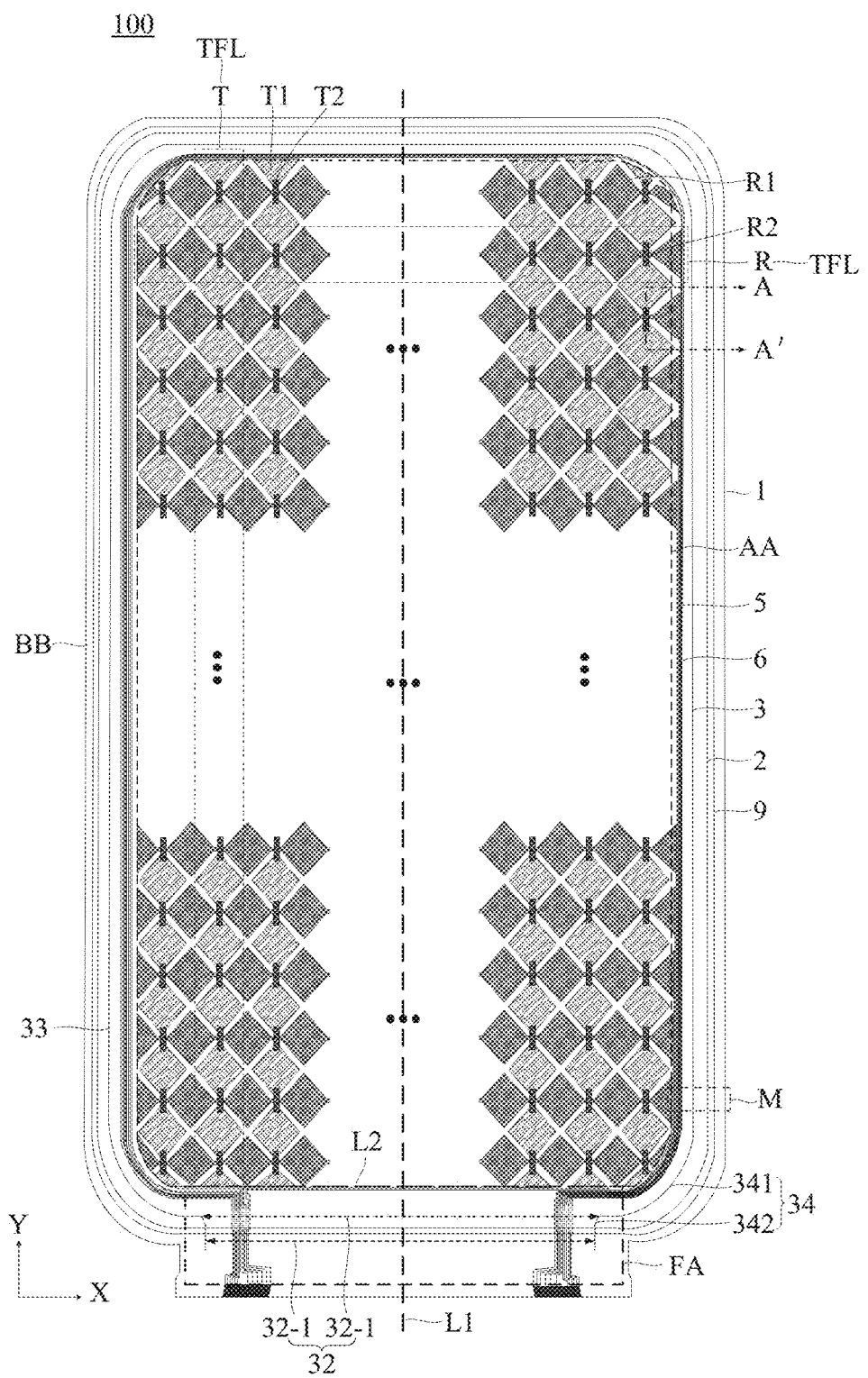
FIG. 1 is a structural diagram of a display panel, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on embodiments of the present disclosure shall be included in the protection scope of the present disclosure.

Unless the context requires otherwise, throughout the specification and the claims, the term "comprise" and other forms thereof such as the third-person singular form"comprises" and the present participle form "comprising" are construed in an open and inclusive sense, i.e., "including, but not limited to". In the description of the specification, terms "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms"first" and "second" are used for descriptive purposes only, and are not to be construed as indicating or implying the relative importance or implicitly indicating the number of indicated technical features. Thus, features defined with "first" and "second" may explicitly or implicitly include one or more of the features. In the description of the embodiments of the present disclosure, the term "a/the plurality of" means two or more unless otherwise specified.

In the description of some embodiments, the term "connected" and its extensions may be used. For example, the term "electrically connected" may be used when describing some embodiments to indicate that two or more components are in direct physical contact or electrical contact with each other.

The phrase "A and/or B" includes the following three combinations: only A, only B, and a combination of A and B.

As used herein, "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

"Same layer" refers to a layer structure formed by using a same film forming process to form a film layer for forming specific patterns, and then using a same mask to form a layer structure through a single patterning process. Depending on the different specific patterns, the single patterning process may include several exposure, development or etching processes, the specific patterns in the formed layer structure may be continuous or discontinuous, and these specific patterns may also be at different heights or have different thicknesses.

Exemplary embodiments are described herein with reference to sectional views and/or plan views as idealized exemplary drawings. In the accompanying drawings, thickness of layers and regions are enlarged for clarity. Therefore, variations in shapes with respect to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. For example, an etched region shown as a rectangle generally has a feature of being curved. Therefore, the regions shown in the accompanying drawings are schematic in nature, and their shapes are not intended to show actual shapes of the regions in a device, and are not intended to limit the scope of the exemplary embodiments.

In the related arts, ink-jet printing (IJP) technology is used to spray ink on a display side of a display panel, and an encapsulation film layer is formed after the ink is dried, so as to block water vapor and air. The display panel has a display area, and a peripheral area disposed around the display area. A barrier wall surrounds the display area, and the barrier wall is used to block flow of the ink, so as to prevent the ink from overflowing, so a position of the barrier wall is a cut-off position of the ink-jet printing. The ink will climb along a side wall of the barrier wall in a drying process, so that a slope will be formed in a region of the encapsulation film layer proximate to the barrier wall, and the slope region of the encapsulation film layer corresponds to the peripheral area of the display panel.

At present, in the peripheral area of the display panel, a plurality of touch wires are formed on a side of the encapsulation film layer away from the display panel by a photolithographic process. Each touch wire is electrically connected to a touch unit in the display area, so as to transmit a sensing signal to the touch unit. However, since the touch wires are located in the slope region of the encapsulation film layer, in the process of manufacturing the touch wires by the photolithographic process, a photoresist used in the photolithographic process has fluidity, and will flow due to gravity in the slope region, so that a thickness of a dried photoresist layer is not uniform, and in turn, a critical dimension bias (CD bias) of the touch wires does not accord with a design value.

In addition, in order to prevent the ink from overflowing the barrier wall, a spray amount of the ink is required to be reduced, but a phenomenon of shrinkage will occurs after the ink is dried. Since a surface of a display substrate of the display panel has a groove, the groove is located on a side of the barrier wall proximate to the display area, and the shrinkage of the ink will prevent the cut-off position of the ink-jet printing from reaching the barrier wall, that is, a border of the encapsulation film layer cannot reach the barrier wall, moreover, the encapsulation film layer may not completely cover the groove. In the process of manufacturing the touch wires by the photolithographic process, the photoresist is thick in the groove that is not covered by the encapsulation film layer, photoresist corresponding to the groove may not be completely removed after exposure and development, thus resulting in film residue between the touch wires, and resulting in a short circuit of the touch wires.

In order to solve above-mentioned problems, as shown in FIG. 1, some embodiments of the present disclosure provides a display panel 100, the display panel 100 has a display area (active area) AA for displaying images.

Figure 7:
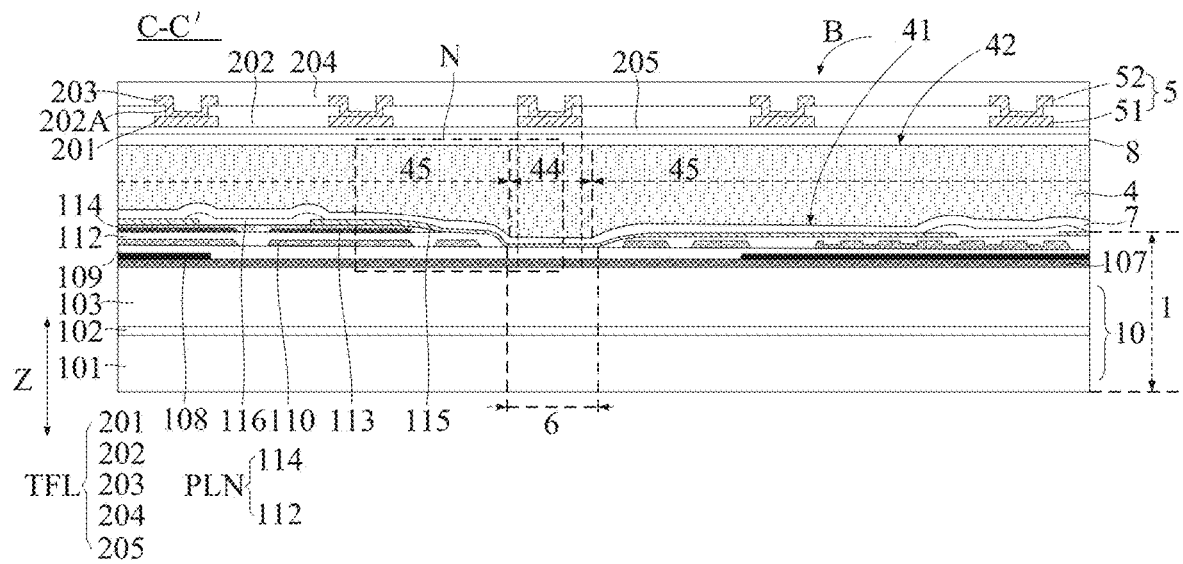
FIG. 7 is a cross-sectional view of the display panel shown in FIG. 3 taken along the line C-C'.

As shown in FIGS. 1 and 7, the display panel 100 includes a display substrate 1, the display substrate 1 has a display side B, and the display side B of the display substrate 1 can display the images.

Figure 2:
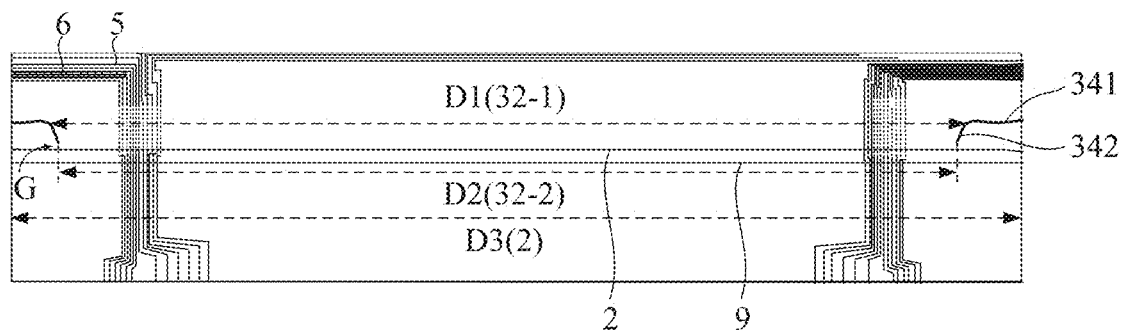
FIG. 2 is a partial enlargement view of the touch lead region of the display panel in FIG. 1.

As shown in FIGS. 1 and 2, the display panel 100 further includes a first barrier wall 2, the first barrier wall 2 is disposed on the display side B of the display substrate 1, and the first barrier wall 2 is disposed around the display area AA, a shape of an orthographic projection of the barrier wall 2 on the display substrate 1 is a dosed annulus.

Figure 16:
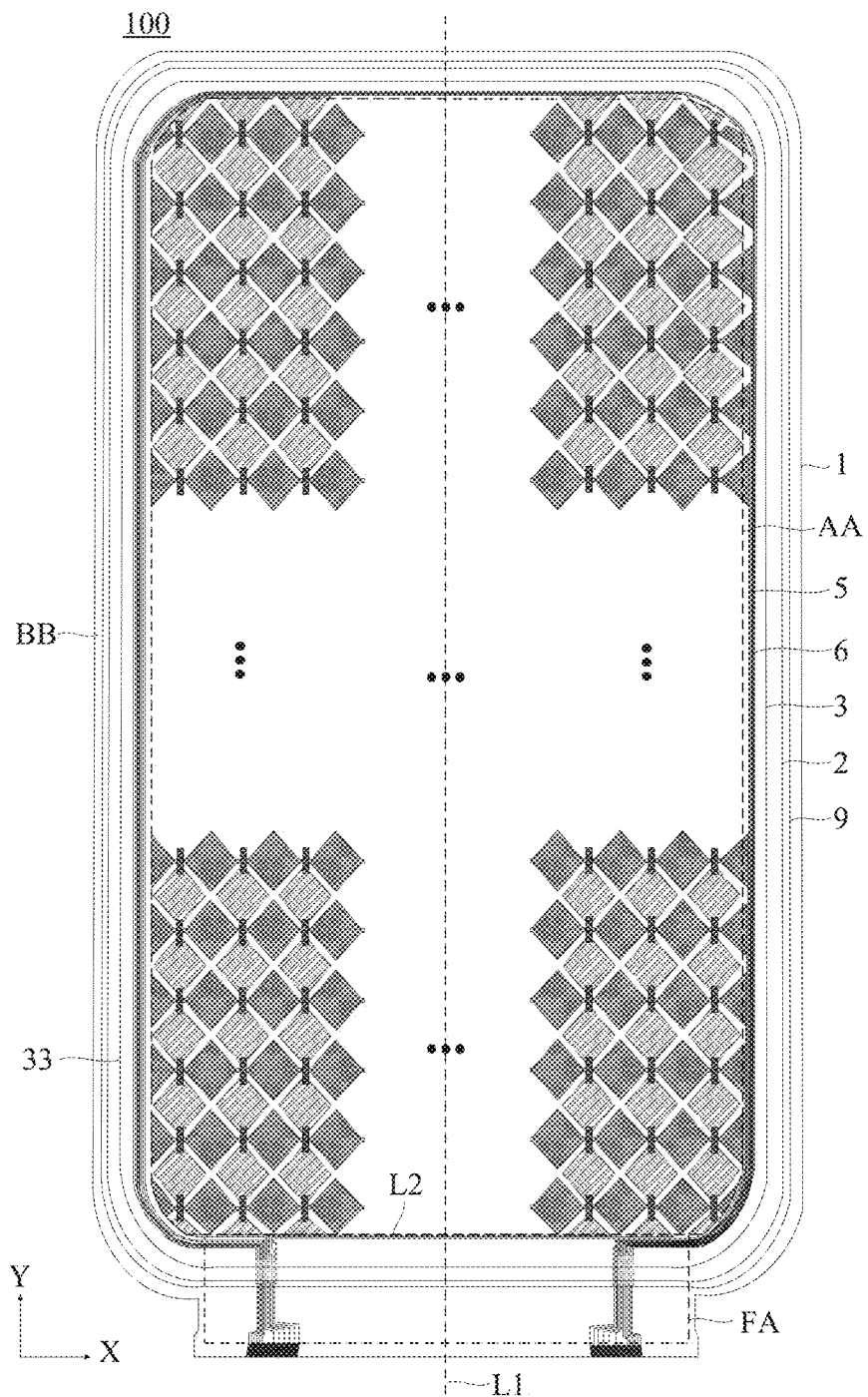
FIG. 16 is a structural diagram of yet another display panel, in accordance with some embodiments of the present disclosure.

As shown in FIGS. 1, 2 and 16, the display panel 100 further includes a blocking portion 3, the blocking portion 3 is disposed between the first barrier wall 2 and the display area AA, and at least a portion of the blocking portion 3 surrounds the display area AA.

It will be understood that, as shown in FIGS. 1 and 2, in a case where the blocking portion 3 partially surrounds the display area AA, a shape of an orthographic projection of the blocking portion 3 on the display substrate 1 is not closed; as shown in FIG. 16, in a case where the blocking portion 3 completely surrounds the display area AA, the shape of the orthographic projection of the blocking portion 3 on the display substrate 1 is a closed annulus.

Figure 3:
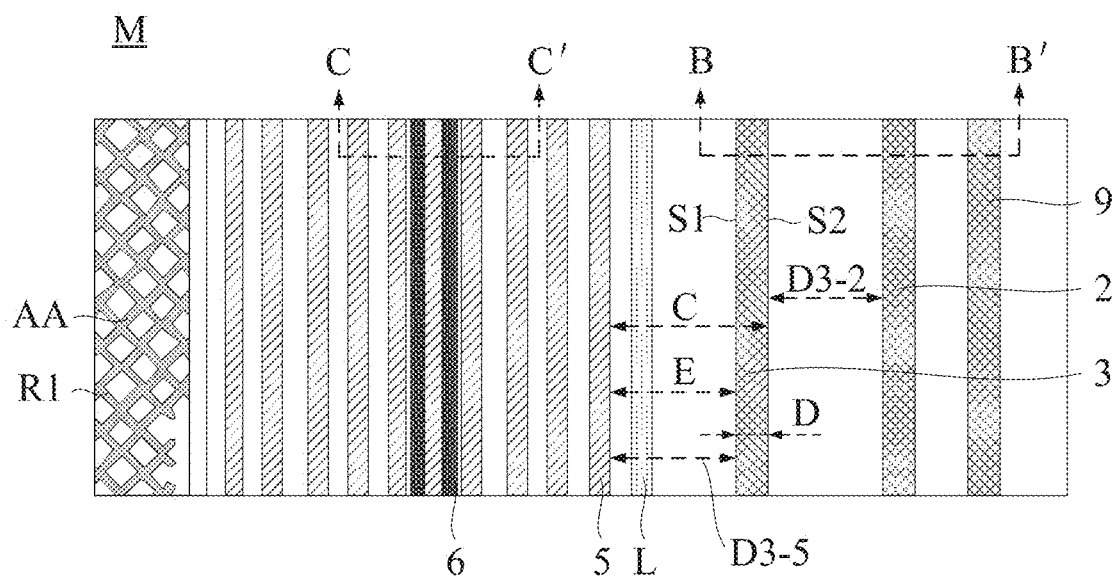
FIG. 3 is a partial enlargement view of the region M of the display panel in FIG. 1.
Figure 4:
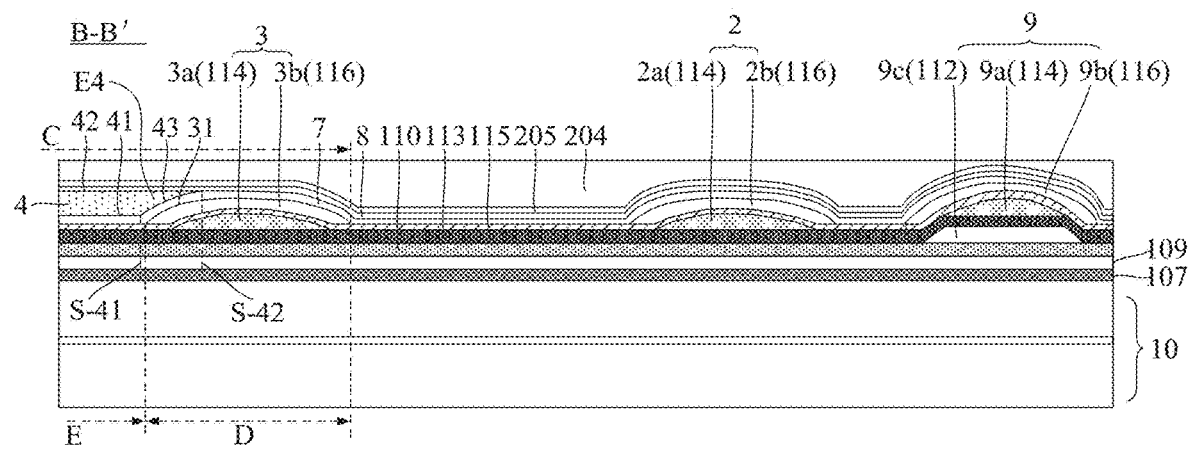
FIG. 4 is a cross-sectional view of the display panel shown in FIG. 3 taken along the line B-B'.

As shown in FIGS. 3 and 4, the display panel 100 further includes a first encapsulation layer 4, and the first encapsulation layer 4 covers at least the display area AA. The first encapsulation layer 4 includes a first surface 41 proximate to the display substrate 1, a second surface 42 away from the display substrate 1, and a transition surface 43 connecting the first surface 41 and the second surface 42.

It will be noted that, in a process of manufacturing the display panel 100, the ink-jet printing technology is used to spray ink on the display side B of the display substrate 1, the first encapsulation layer 4 is formed after the ink is dried, and the first encapsulation layer 4 plays a role of absorbing water vapor, so as to ensure good encapsulation of the display panel 100. Both the blocking portion 3 and the first barrier wall 2 can play a role of blocking the ink, so as to prevent the ink from flowing around.

It will be understood that, since the ink has fluidity and the ink is leveled due to an action of the gravity, in the first encapsulation layer 4 formed after drying the ink, the first surface 41 is attached to a surface of the display substrate 1, the transition surface 43 is not flat, and the second surface 42 is relatively flat.

It will be mentioned that a shape of the transition surface 43 of the first encapsulation layer 4 depends on a cut-off position of the ink-jet printing. In a case where the cut-off position of the ink-jet printing reaches the blocking portion 3, the shape of the transition surface 43 is adapted to a surface of the blocking portion 3 with which the transition surface 43 is in contact. For example, as shown in FIG. 4, the surface of the blocking portion 3 contacted by the transition surface 43 of the first encapsulation layer 4 is an arc-shaped slope surface 31, so that the transition surface 43 of the first encapsulation layer 4 is an arc-shaped surface, and the arc-shaped surface is bent towards an inside of the first encapsulation layer 4.

For example, the first encapsulation layer 4 is an organic barrier layer having flexibility and a function of absorbing water vapor. For example, a material of the ink required to fabricate the first encapsulation layer 4 may include an acrylic-based polymer.

As shown in FIGS. 3 and 7, the display panel 100 further includes a plurality of touch wires 5. As shown in FIG. 7, the plurality of touch wires 5 are disposed on a side of the first encapsulation layer 4 away from the display substrate 1. Orthographic projections of the plurality of touch wires 5 on the display substrate 1 at least partially overlaps with an orthographic projection of the second surface 42 of the first encapsulation layer 4 on the display substrate 1, and are staggered with an orthographic projection of the transition surface 43 on the display substrate 1.

It will be noted that each touch wire 5 is electrically connected to a touch unit located in the display area AA, and is used for transmitting a sensing signal to the touch unit.

For example, the orthographic projections of the plurality of touch wires 5 on the display substrate 1 are located within a range of the orthographic projection of the second surface 42 on the display substrate 1, and are staggered with the orthographic projection of the transition surface 43 on the display substrate 1.

Figure 5:
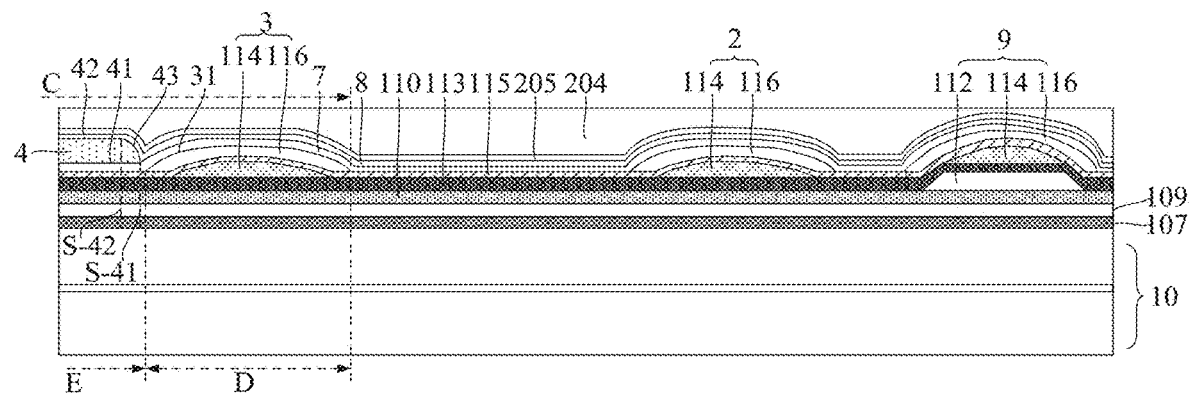
FIG. 5 is a structural diagram of another display panel, in accordance with some embodiments of the present disclosure.

As shown in FIGS. 3 to 5, at least a portion of the orthographic projection of the transition surface 43 of the first encapsulation layer 4 on the display substrate 1 is located in a region C between a border S2, away from the display area AA, of an orthographic projection of the blocking portion 3 on the display substrate 1 and an orthographic projection of a touch wire 5 farthest away from the display area AA among the plurality of touch wires 5 on the display substrate 1.

For example, the orthographic projection of the transition surface 43 on the display substrate 1 is entirely located in the region C between the border S2, away from the display area AA, of the orthographic projection of the blocking portion 3 on the display substrate 1 and the orthographic projection of the touch wire 5 farthest away from the display area AA among the plurality of touch wires 5 on the display substrate 1.

In the display panel 100 in the above-mentioned embodiments of the present disclosure, the orthographic projection of the transition surface 43 of the first encapsulation layer 4 on the display substrate 1 is located in the region between the border S2, away from the display area AA, of the orthographic projection of the blocking portion 3 on the display substrate 1 and the orthographic projection of the touch wire 5 farthest away from the display area AA among the plurality of touch wires 5 on the display substrate 1, that is, the cut-off position of ink-jet printing is at the blocking portion 3, and the border of the first encapsulation layer 4 may reach the blocking portion 3. Since the second surface 42 of the first encapsulation layer 4 is flatter than the transition surface 43, the plurality of touch wires 5 are disposed on the side of the first encapsulation layer 4 away from the display substrate 1 (the second surface 42 of the first encapsulation layer 4) to avoid providing the plurality of touch wires 5 on the transition surface 43 of the first encapsulation layer 4, which is beneficial to control the critical dimension bias (CD bias) of the touch wires 5.

Moreover, the orthographic projections of the plurality of touch wires 5 on the display substrate 1 at least partially overlap with the orthographic projection of the second surface 42 on the display substrate 1, and are staggered with the orthographic projection of the transition surface 43 on the display substrate 1, so that the second surface 42 of the first encapsulation layer 4 may cover a region on the display substrate 1 corresponding to the touch wires 5, so as to improve surface flatness of the display substrate 1 in this region. In the process of manufacturing the touch wires 5 by adopting the photolithographic process, the film residue between the touch wires 5 due to the incomplete removal of the photoresist may be avoided, so as to avoid the short circuit of the touch wires 5.

In some embodiments, as shown in FIG. 4, an acute angle (a slope gradient of the slope surface 31) between the slope surface 31 of the blocking portion 3 and a plane where the display substrate 1 is located is in a range of 40 degrees to 60 degrees, inclusive. For example, the slope gradient of the slope surface 31 is 40 degrees, 45 degrees, 50 degrees, 55 degrees or 60 degrees.

Figure 6:
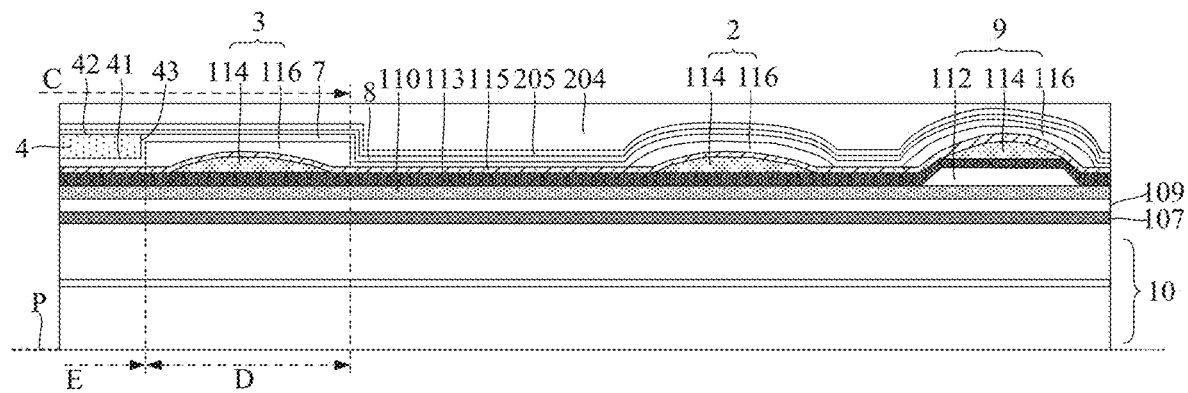
FIG. 6 is a structural diagram of yet another display panel, in accordance with some embodiments of the present disclosure.

In some embodiments, as shown in FIGS. 4 to 6, of the first encapsulation layer 4, a minimum included angle between the transition surface 43 and the first surface 41 is in a range of 30 degrees to 90 degrees, inclusive. For example, the minimum included angle is 40 degrees, 50 degrees, 65 degrees, 80 degrees, or 90 degrees.

As shown in FIGS. 4 to 6, of the first encapsulation layer 4, a minimum included angle between the transition surface 43 and the second surface 42 is in a range of 0 degrees to 90 degrees. For example, the minimum angle is 0 degrees, 30 degrees, 45 degrees, 80 degrees or 90 degrees.

An arrangement of the first encapsulation layer 4 will be described below.

In some embodiments, as shown in FIGS. 3 and 4, at least a portion of a border S1, proximate to the display area AA, of the orthographic projection of the blocking portion 3 on the display substrate 1 is within a range of the orthographic projection of the transition surface 43 of the first encapsulation layer 4 on the display substrate 1.

For example, the border S1, proximate to the display area AA, of the orthographic projection of the blocking portion 3 on the display substrate 1 is within the range of the orthographic projection of the transition surface 43 of the first encapsulation layer 4 on the display substrate 1.

It will be noted that, the description that the at least a portion of the border S1, proximate to the display area AA, of the orthographic projection of the blocking portion 3 on the display substrate 1 is within the range of the orthographic projection of the transition surface 43 of the first encapsulation layer 4 on the display substrate 1 refers to the following situation:

the border S1, proximate to the display area AA, of the orthographic projection of the blocking portion 3 on the display substrate 1 at least partially coincides with the border of the orthographic projection of the transition surface 43 of the first encapsulation layer 4 on the display substrate 1;

alternatively, the border S1, proximate to the display area AA, of the orthographic projection of the blocking portion 3 on the display substrate 1 is within the range of the orthographic projection of the transition surface 43 of the first encapsulation layer 4 on the display substrate 1, and the border S1, proximate to the display area AA, of the orthographic projection of the blocking portion 3 on the display substrate 1 does not coincide with the border of the orthographic projection of the transition surface 43 of the first encapsulation layer 4 on the display substrate 1.

As shown in FIGS. 3 and 4, at least a portion of a border S-41 of an orthographic projection of the first surface 41 of the first encapsulation layer 4 on the display substrate 1 is located in a region E between the border S1, proximate to the display area AA, of the orthographic projection of the blocking portion 3 on the display substrate 1 and the orthographic projection of the touch wire 5 farthest away from the display area AA among the plurality of touch wires 5 on the display substrate 1.

For example, the border S-41 of the orthographic projection of the first surface 41 of the first encapsulation layer 4 on the display substrate 1 is located in the region E between the border S1, proximate to the display area AA, of the orthographic projection of the blocking portion 3 on the display substrate 1 and the orthographic projection of the touch wire 5 farthest away from the display area AA among the plurality of touch wires 5 on the display substrate 1.

It will be noted that, the description that the at least a portion of the border S-41 of the orthographic projection of the first surface 41 of the first encapsulation layer 4 on the display substrate 1 is located in the region E between the border S1, proximate to the display area AA, of the orthographic projection of the blocking portion 3 on the display substrate 1 and the orthographic projection of the touch wire 5 farthest away from the display area AA among the plurality of touch wires 5 on the display substrate 1 refers to the following situation:

the border S-41 of the orthographic projection of the first surface 41 on the display substrate 1 coincides with the border S1, proximate to the display area AA, of the orthographic projection of the blocking portion 3 on the display substrate 1;

alternatively, the border S-41 of the orthographic projection of the first surface 41 on the display substrate 1 coincides with the orthographic projection of the touch wire 5 farthest away from the display area AA among the plurality of touch wires 5 on the display substrate 1;

alternatively, the border S-41 of the orthographic projection of the first surface 41 on the display substrate 1 is located in the region E between the border S1, proximate to the display area AA, of the orthographic projection of the blocking portion 3 on the display substrate 1 and the orthographic projection of the touch wire 5 farthest away from the display area AA among the plurality of touch wires 5 on the display substrate 1. In addition, the border S-41 of the orthographic projection of the first surface 41 on the display substrate 1 does not coincide with the border S1, proximate to the display area AA, of the orthographic projection of the blocking portion 3 on the display substrate 1; and the border S-41 of the orthographic projection of the first surface 41 on the display substrate 1 does not coincide with the orthographic projection of the touch wire 5 farthest away from the display area AA among the plurality of touch wires 5 on the display substrate 1.

As shown in FIGS. 3 and 4, at least a portion of a border S-42 of the orthographic projection of the second surface 42 of the first encapsulation layer 4 on the display substrate 1 is located in a region D between the border S1, proximate to the display area AA, of the orthographic projection of the blocking portion 3 on the display substrate 1 and the border S2, away from the display area AA, of the orthographic projection of the blocking portion 3 on the display substrate 1.

For example, the border S-42 of the orthographic projection of the second surface 42 of the first encapsulation layer 4 on the display substrate 1 is located in the region D between the border S1, proximate to the display area AA, of the orthographic projection of the blocking portion 3 on the display substrate 1 and the border S2, away from the display area AA, of the orthographic projection of the blocking portion 3 on the display substrate 1.

It will be noted that, the description that the at least a portion of the border S-42 of the orthographic projection of the second surface 42 of the first encapsulation layer 4 on the display substrate 1 being located in the region D between the border S1, proximate to the display area AA, of the orthographic projection of the blocking portion 3 on the display substrate 1 and the border S2, away from the display area AA, of the orthographic projection of the blocking portion 3 on the display substrate 1 refers to the following situation:

the border S-42 of the orthographic projection of the second surface 42 on the display substrate 1 coincides with the border S1, proximate to the display area AA, of the orthographic projection of the blocking portion 3 on the display substrate 1;

alternatively, the border S-42 of the orthographic projection of the second surface 42 on the display substrate 1 coincides with the border S2, away from the display area AA, of the orthographic projection of the blocking portion 3 on the display substrate 1;

alternatively, the border S-42 of the orthographic projection of the second surface 42 on the display substrate 1 is within a range of the orthographic projection of the blocking portion 3 on the display substrate 1. In addition, the border S-42 of the orthographic projection of the second surface 42 on the display substrate 1 does not coincide with the border S1, proximate to the display area AA, of the orthographic projection of the blocking portion 3 on the display substrate 1; and the border S-42 of the orthographic projection of the second surface 42 on the display substrate 1 does not coincide with the border S2, away from the display area AA, of the orthographic projection of the blocking portion 3 on the display substrate 1.

In the embodiments of the present disclosure, it may be seen with reference to FIG. 4 that the ink printed by the ink-jet printing exceeds the at least a portion of the border S1, proximate to the display area AA, of the orthographic projection of the blocking portion 3 on the display substrate 1, and the ink just does not overflow the blocking portion 3, which improves the phenomenon that the ink climbs along the slope surface 31 of an edge portion, proximate to the display area AA, of the blocking portion 3. After the ink is dried, the at least a portion of the border S1, proximate to the display area AA, of the orthographic projection of the blocking portion 3 on the display substrate 1 is located within the range of the orthographic projection of the transition surface 43 of the first encapsulation layer 4 on the display substrate 1, so as to ensure the flatness of the second surface 42 of the first encapsulation layer 4.

In some embodiments, as shown in FIG. 4, an edge portion E4 of the first encapsulation layer 4 proximate to the blocking portion 3 climbs along the slope surface 31.

It will be noted that the edge portion E4 of the first encapsulation layer 4 proximate to the blocking portion 3 climbs along the slope surface 31 due to that a sprayed amount of the ink is relatively large, so that a region of the slope surface 31 of the blocking portion 3 will be filled due to the fluidity of the ink, thereby improving the phenomenon that the ink climbs along the slope surface 31 of the blocking portion 3, which is beneficial to improve the flatness of the second surface 42 of the first encapsulation layer 4.

In some embodiments, as shown in FIG. 4, the transition surface 43 of the first encapsulation layer 4 is an arc-shaped surface, and the shape of the arc-shaped surface is adapted to the shape of the slope surface 31.

It will be understood that the edge portion E4 of the first encapsulation layer 4 proximate to the blocking portion 3 climbs along the slope surface 31, and the transition surface 43 of the first encapsulation layer 4 is in contact with the slope surface 31 of the blocking portion 3 (in a case where the slope surface 31 of the blocking portion 3 is further covered with another encapsulation film layer, the transition surface 43 of the first encapsulation layer 4 is in contact with the another encapsulation film layer). Due to the fluidity of the ink printed by ink-jet printing, the first encapsulation layer 4 formed after drying may be well attached to the blocking portion 3 (or the another encapsulation film layer covering the slope surface 31), so that the shape of the arc-shaped surface of the first encapsulation layer 4 is adapted to the shape of the slope surface 31.

In some embodiments, as shown in FIG. 4, the transition surface 43 of the first encapsulation layer 4 is the arc-shaped surface, and the arc-shaped surface is bent towards the inside of the first encapsulation layer 4.

It will be understood that, referring to FIG. 4, the blocking portion 3 has the sloped surface 31, in this case, the transition surface 43 of the first encapsulation layer 4 is adapted to a side surface of the blocking portion 3, as a result, the transition surface 43 of the first encapsulation layer 4 is the arc-shaped surface, and the arc-shaped surface is bent toward the inside of the first encapsulation layer 4.

Another arrangement of the first encapsulation layer 4 will be described below.

In some embodiments, as shown in FIG. 5, the at least a portion of the border S-41 of the orthographic projection of the first surface 41 of the first encapsulation layer 4 on the display substrate 1, and the at least a portion of the border S-42 of the orthographic projection of the second surface 42 of the first encapsulation layer 4 in the display substrate 1 are both located in the region E between the border S1, proximate to the display area AA, of the orthographic projection of the blocking portion 3 on the display substrate 1 and the orthographic projection of the touch wire 5 farthest away from the display area AA among the plurality of touch wires 5 on the display substrate 1.

For example, both the border S-41 of the orthographic projection of the first surface 41 of the first encapsulation layer 4 on the display substrate 1, and the border S-42 of the orthographic projection of the second surface 42 of the first encapsulation layer 4 on the display substrate 1 are located in the region E between the border S1, proximate to the display area AA, of the orthographic projection of the blocking portion 3 on the display substrate 1 and the orthographic projection of the touch wire 5 farthest away from the display area AA among the plurality of touch wires 5 on the display substrate 1.

It will be noted that, the description that the at least a portion of the border S-41 of the orthographic projection of the first surface 41 of the first encapsulation layer 4 on the display substrate 1, and the at least a portion of the border S-42 of the orthographic projection of the second surface 42 of the first encapsulation layer 4 on the display substrate 1 are both located in the region E between the border S1, proximate to the display area AA, of the orthographic projection of the blocking portion 3 on the display substrate 1 and the orthographic projection of the touch wire 5 farthest away from the display area AA among the plurality of touch wires 5 on the display substrate 1 refers to the following situation:

both the border S-41 of the orthographic projection of the first surface 41 of the first encapsulation layer 4 on the display substrate 1, and the border S-42 of the orthographic projection of the second surface 42 of the first encapsulation layer 4 on the display substrate 1 coincide with the border S1, proximate to the display area AA, of the orthographic projection of the blocking portion 3 on the display substrate 1;

alternatively, both the border S-41 of the orthographic projection of the first surface 41 of the first encapsulation layer 4 on the display substrate 1, and the border S-42 of the orthographic projection of the second surface 42 of the first encapsulation layer 4 on the display substrate 1 coincide with the orthographic projection of the touch wire 5 farthest away from the display area AA among the plurality of touch wires 5 on the display substrate 1;

alternatively, both the border S-41 of the orthographic projection of the first surface 41 of the first encapsulation layer 4 on the display substrate 1, and the border S-42 of the orthographic projection of the second surface 42 of the first encapsulation layer 4 on the display substrate 1 are located in the region E between the border S1, proximate to the display area AA, of the orthographic projection of the blocking portion 3 on the display substrate 1 and the orthographic projection of the touch wire 5 farthest away from the display area AA among the plurality of touch wires 5 on the display substrate 1. In addition, both the border S-41 of the orthographic projection of the first surface 41 of the first encapsulation layer 4 on the display substrate 1, and the border S-42 of the orthographic projection of the second surface 42 of the first encapsulation layer 4 on the display substrate 1 do not coincide with the border S1, proximate to the display area AA, of the orthographic projection of the blocking portion 3 on the display substrate 1; and both the border S-41 of the orthographic projection of the first surface 41 of the first encapsulation layer 4 on the display substrate 1, and the border S-42 of the orthographic projection of the second surface 42 of the first encapsulation layer 4 on the display substrate 1 do not coincide with the orthographic projection of the touch wire 5 farthest away from the display area AA among the plurality of touch wires 5 on the display substrate 1.

In the above-mentioned embodiments of the present disclosure, with reference to FIG. 5, the at least a portion of the border S-41 of the orthographic projection of the first surface 41 of the first encapsulation layer 4 on the display substrate 1, and the at least a portion of the border S-42 of the orthographic projection of the second surface 42 of the first encapsulation layer 4 on the display substrate 1 do not reach or just reach the border S1, proximate to the display area AA, of the orthographic projection of the blocking portion 3 on the display substrate 1. It will be seen that in the drying process of the ink, the sprayed amount of the ink is relatively small, so that the ink is not enough to climb along the slope surface 31 of the blocking portion 3. Moreover, since the ink has fluidity and the ink is leveled due to the action of the gravity, the second surface 42 of the first encapsulation layer 4 is relatively flat.

It will be noted that the sprayed amount of the ink should ensure that the cut-off position of ink-jet printing may reach the touch wire 5 farthest away from the display area AA among the plurality of touch wires 5, so as to make the at least a portion of the border S-41 of the orthographic projection of the first surface 41 of the first encapsulation layer 4 on the display substrate 1, and the at least a portion of the border S-42 of the orthographic projection of the second surface 42 of the first encapsulation layer 4 on the display substrate 1 reach or exceed the orthographic projection of the touch wire 5 farthest away from the display area AA among the plurality of touch wires 5 on the display substrate 1. As a result, the orthographic projections of the plurality of touch wires 5 on the display substrate 1 are within the range of the orthographic projection of the first encapsulation layer 4 on the display substrate 1.

Yet another arrangement of the first encapsulation layer 4 will be described below.

In some embodiments, as shown in FIG. 6, the transition surface 43 of the first encapsulation layer 4 is substantially perpendicular to the plane P where the display substrate 1 is located.

It will be understood that, referring to FIG. 6, the side surface of the blocking portion 3 is substantially perpendicular to the plane P where the display substrate 1 is located. In this case, since the ink has fluidity, the transition surface 43 of the first encapsulation layer 4 is adapted to the side surface of the blocking portion 3, as a result, the transition surface 43 of the first encapsulation layer 4 is substantially perpendicular to the plane P where the display substrate 1 is located.

The display panel 100 provided by some embodiments of the present disclosure is described by considering an example where the display panel 100 is an organic light-emitting diode (OLED) display panel.

Figure 8:
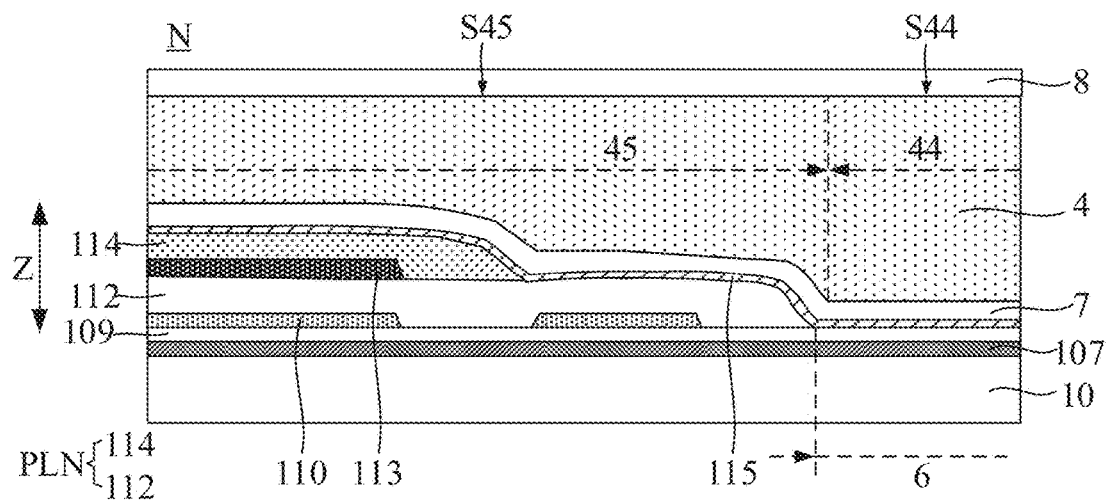
FIG. 8 is a partial enlargement view of the region N of the display panel in FIG. 1.
Figure 9:
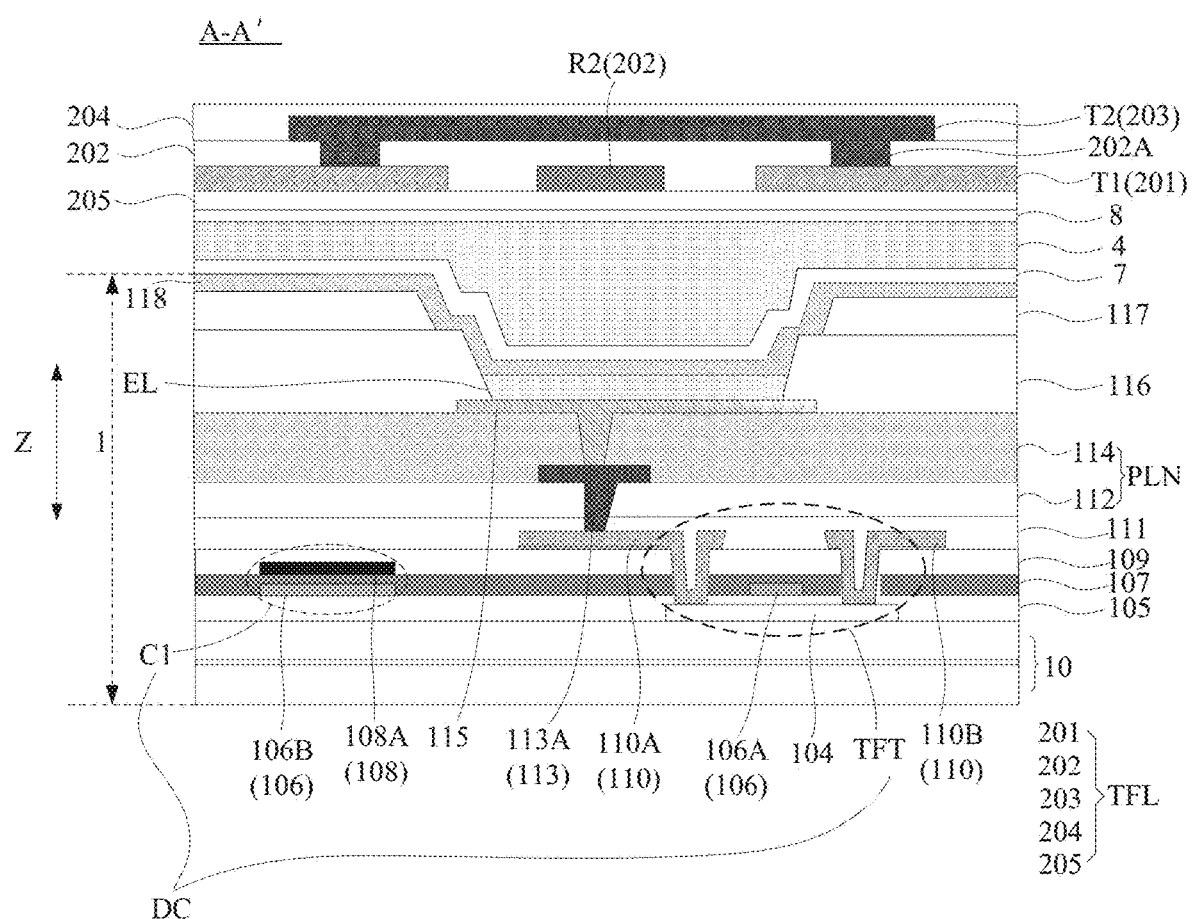
FIG. 9 is a cross-sectional view of the display panel shown in FIG. 1 taken along the line A-A'.

In some embodiments, as shown in FIGS. 7 to 9, the display substrate 1 includes a substrate 10, and driving circuits and light-emitting devices 12 that are stacked on the substrate 10.

For example, the substrate 10 may be a flexible substrate, which may increase flexibility of the display substrate 1, so that the display substrate 1 has properties of being bendable, foldable, and the like, so as to expand a scope of application of the display substrate 1.

For example, the substrate 10 may be a rigid substrate, and properties of the substrate 10 may be determined according to actual needs of a product.

For example, the substrate 10 may be of a single layer structure, for example, the substrate 10 is a glass substrate.

For example, the substrate 10 may be of a multi-layer structure, for example, as shown in FIG. 7, the substrate 10 may include a first polyimide layer 101, a buffer layer 102 and a second polyimide layer 103 that are stacked in sequence. For another example, the substrate 10 may include a polyimide layer and a buffer layer that are stacked in sequence. For yet another example, the substrate 10 may include a plurality of polyimide layers and a plurality of buffer layers that are stacked in sequence.

For example, a material of the buffer layer 102 may include an inorganic material. For example, the material of the buffer layer 102 may include silicon nitride, silicon oxide or silicon oxynitride, which may block water vapor, air and alkaline ions.

In some embodiments, as shown in FIG. 9, the display substrate 1 includes active layers 104, a first gate insulating layer 105, a first gate conductive layer 106, a second gate insulating layer 107, a second gate conductive layer 108, an interlayer dielectric layer 109 and a first source-drain conductive layer 110 that are stacked on the substrate 10 in sequence.

The first gate insulating layer 105 insulates the active layers 104 from the first gate conductive layer 106, the second gate insulating layer 107 insulates the first gate conductive layer 106 from the second gate conductive layer 108, and the interlayer dielectric layer 109 insulates the second gate conductive layer 108 from the first source-drain conductive layer 110.

As shown in FIG. 9, the driving circuit includes a plurality of thin film transistors TFT and a plurality of capacitor structures C1, and FIG. 9 only shows a thin film transistor TFT and a capacitor structure C1.

As shown in FIG. 9, the thin film transistor TFT includes an active layer 104, a portion of the first gate insulating layer 105, a gate 106A disposed in the first gate conductive layer 106, a portion of the second gate insulating layer 107, a portion of the interlayer dielectric layer 109, and a source 110A and a drain 110B that are disposed in the first source-drain conductive layer 110.

For example, the active layer 104 may be disposed on the substrate 10, and the first gate insulating layer 105 covers the substrate 10 and the active layer 104; the gate 106A is disposed on a side of the first gate insulating layer 105 away from the substrate 10, the second gate insulating layer 107 covers the gate 106A and the first gate insulating layer 105, and the interlayer dielectric layer 109 covers the second gate insulating layer 107; the source 110A and the drain 110B are disposed on a side of the interlayer dielectric layer 109 away from the substrate 10, and the source 110A and the drain 110B may each be electrically connected to the active layer 104 through a via hole penetrating through the interlayer dielectric layer 109, the second gate insulating layer 107 and the first gate insulating layer 105.

It will be understood that the gate 106A is disposed on a side of the active layer 104 away from the substrate 10, that is, the gate 106A is located above the active layer 104. In this case, the thin film transistor TFT is a top-gate thin film transistor. In some other embodiments, the gate 106A may be disposed on a side of the active layer 104 proximate to the substrate 10, that is, the gate 106A is located below the active layer 104. In this case, the thin film transistor TFT is a bottom-gate thin film transistor.

For example, materials of the first gate insulating layer 105, the second gate insulating layer 107 and the interlayer dielectric layer 109 each includes an inorganic material. For example, the materials may each include silicon oxide, silicon nitride or silicon oxynitride, which may block water vapor, air and alkaline ions.

For example, materials of the source 110A and the drain 110B may include metal materials or alloy materials. For example, the materials of the source 110A and the drain 110B may include molybdenum, aluminum, or titanium.

For example, the source 110A and the drain 110B may be of a single-layer structure, for example, the source 110A and the drain 110B are each a molybdenum metal layer, an aluminum metal layer or a titanium metal layer.

For example, the source 110A and the drain 110B may be of a multi-layer structure. For example, the source 110A and the drain 110B are each three layers of metals of titanium (Ti), aluminum (Al), and titanium (Ti) that are stacked.

As shown in FIG. 9, the capacitor structure C1 may include a first plate 106B disposed in the first gate conductive layer 106, and a second plate 108A disposed in the second gate conductive layer 108. The first plate 106B is disposed in the same layer as the gate 106A. The second plate 108A is disposed between the second gate insulating layer 107 and the interlayer dielectric layer 109, and is disposed opposite to the first plate 106B.

For example, materials of the gate 106A, the first plate 106B and the second plate 108A may include metal materials or alloy materials. For example, the materials may include molybdenum, aluminum, or titanium.

In some embodiments, the display substrate 1 further includes planarization layer(s) PLN disposed on the substrate 10. The display substrate 1 is provided with a groove 6 located between the blocking portion 3 and the display area AA. The groove 6 at least partially surrounds the display area AA, and the groove 6 at least partially penetrates the planarization layer(s) PLN in a thickness direction Z of the display substrate 1.

It will be noted that, the display substrate 1 further includes a first gate driving circuit and a second gate driving circuit that are disposed on the substrate 10, and the first gate driving circuit and the second gate driving circuit are arranged in parallel in a second direction X. The groove 6 is at least partially located in a region between the first gate driving circuit and the second gate driving circuit, an orthogonal projection of the groove 6 on the substrate 10 is not overlapped with an orthographic projection of the first gate driving circuit on the substrate 10, and is not overlapped with an orthographic projection of the second gate driving circuit on the substrate 10.

For example, the planarization layer(s) may be of a single-layer structure or a multi-layer structure.

For example, a material of the planarization layer(s) may include an organic material. For example, the material of the planarization layer(s) may include a photoresist, an acrylic-based polymer, or a silicon-based polymer.

For example, the groove 6 partially surrounds the display area AA.

As shown in FIGS. 3 and 7, since an arrangement space of the touch wires 5 is limited and a number of the touch wires 5 is large, an orthographic projection of at least one touch wire 5 in the plurality of touch wires 5 on the display substrate 1 at least partially overlaps with a region where the groove 6 is located.

For example, an orthographic projection of a touch wire 5 among the touch wires 5 on the display substrate 1 overlaps with the region where the groove 6 is located.

In some embodiments, as shown in FIGS. 7 to 9, the planarization layer(s) PLN includes a first planarization layer 112 disposed on the substrate 10, and a second planarization layer 114 disposed on a side of the first planarization layer 112 away from the substrate 10.

For example, the first planarization layer 112 and the second planarization layer 114 may be of a single-layer structure or a multi-layer structure.

The groove 6 at least partially penetrates the first planarization layer 112 in the thickness direction Z of the display substrate 1.

Alternatively, the groove 6 at least partially penetrates the second planarization layer 114 in the thickness direction Z of the display substrate 1.

Alternatively, as shown in FIG. 7, the groove 6 at least partially penetrates the first planarization layer 112 and the second planarization layer 114 in the thickness direction Z of the display substrate 1.

With reference to FIG. 7, the first source-drain conductive layer 110 and a second source-drain conductive layer 113 are not provided in the region where the groove 6 is located, therefore, the first planarization layer 112 and the second planarization layer 114 do not need to be provided in the region where the groove 6 is located. It will be understood that the groove 6 at least partially penetrates the first planarization layer 112 and the second planarization layer 114.

In some embodiments, as shown in FIGS. 7 and 8, the first encapsulation layer 4 includes a filling portion 44 filling the groove 6, and a covering portion 45 located in at least a portion of a region in the display substrate 1 other than the groove 6. As shown in FIG. 8, a surface S44 of the filling portion 44 of the first encapsulation layer 4 away from the display substrate 1 is substantially on a same plane as a surface S45 of the covering portion 45 away from the display substrate 1.

For example, the covering portion 45 of the first encapsulation layer 4 is disposed in a portion of the region in the display substrate 1 other than the groove 6.

It will be understood that, since the ink has fluidity, the ink may fill the groove 6 due to the action of gravity, as a result, the surface S44 of the filling portion 44 of the formed first encapsulation layer 4 away from the display substrate 1 after the ink is dried is substantially in the same plane as the surface S45 of the covering portion 45 away from the display substrate 1.

Through the above-mentioned arrangement, the groove 6 is filled with the ink, so that the second surface 42 of the first encapsulation layer 4 is relatively flat. In the process of manufacturing the touch wires by using the photolithographic process, the film residue between the touch wires 5 due to the incomplete removal of the photoresist may be avoided, so as to avoid the short circuit of the touch wires 5.

In some embodiments, as shown in FIG. 9, the display substrate 1 further includes a passivation layer 111 disposed between the first source-drain conductive layer 110 and the first planarization layer 112, and the passivation layer 111 covers the source 110A and the drain 110B, so as to protect the source 110A and the drain 110B.

For example, a material of the passivation layer 111 may include an inorganic material. For example, the material of the passivation layer 111 may include silicon oxide, silicon nitride, or silicon oxynitride.

In some embodiments, as shown in FIGS. 7 to 9, the display substrate 1 further includes the second source-drain conductive layer 113 disposed on a side of the first planarization layer 112 away from the substrate 10. The second source-drain conductive layer 113 includes transfer electrodes 113A. The transfer electrode 113A is electrically connected to the source 110A or the drain 110B through a via hole penetrating both the first planarization layer 112 and the passivation layer 111. FIG. 9 shows a case where the transfer electrode 113A is electrically connected to the source 110A through the via hole penetrating both the first planarization layer 112 and the passivation layer 111.

For example, a material of the transfer electrode 113A may include a metal material or an alloy material. For example, the material of the transfer electrode 113A may include molybdenum, aluminum, or titanium.

For example, the transfer electrode 113A may be of a single-layer structure. For example, the transfer electrode 113A is a molybdenum metal layer, an aluminum metal layer, or a titanium metal layer.

For example, the transfer electrode 113A may be of a multi-layer structure. For example, the transfer electrode 113A is three layers of metals of titanium (Ti), aluminum (Al), and titanium (Ti) that are stacked.

In some embodiments, as shown in FIGS. 7 to 9, the display substrate 1 further includes first electrodes 115 disposed on a side of the second planarization layer 114 away from the substrate 10. The first electrode 115 is electrically connected to a transfer electrode 113A through a via hole in the second planarization layer 114, so that a voltage signal can be transmitted from the source 110A to the first electrode 115 through the transfer electrode 113A.

For example, a material of the first electrode 115 may include indium tin oxide, indium zinc oxide, or zinc oxide.

In some embodiments, as shown in FIG. 9, the display substrate 1 further includes a pixel defining layer 116 disposed on a side of the planarization layer 114 away from the substrate 10. The pixel defining layer 116 has a plurality of openings, each opening exposes at least a portion of a first electrode 115, and each opening is located in a sub-pixel region.

For example, as shown in FIG. 9, each opening exposes a middle portion of the first electrode 115, and the pixel defining layer 116 covers an edge portion of the first electrode 115.

For example, a material of the pixel defining layer 116 may include an organic material. For example, the material of the pixel defining layer 116 may include a photoresist.

In some examples, as shown in FIG. 9, a light-emitting device includes a first electrode 115, a light-emitting functional layer 112 and a second electrode 118.

As shown in FIG. 9, the light-emitting functional layer EL is located in the opening of the pixel defining layer 116 and formed on the first electrode 115. The light-emitting functional layer EL may be made of a small molecular organic material or a polymer molecular organic material, which may be a fluorescent light-emitting material or a phosphorescence light-emitting material, so that the light-emitting functional layer EL can emit red light, green light, blue light, or white light. In addition, according to different actual needs, in different examples, the light-emitting functional layer EL may further includes one or more of an electron transporting layer (ETL), an electron injection layer (EIL), a hole transporting layer (HTL), and a hole injection layer (HIL).

As shown in FIG. 9, the second electrode 118 covers the light-emitting functional layer EL, and a polarity of the second electrode 118 is opposite to a polarity of the first electrode 115. Voltage signals are transmitted to the first electrode 115 and the second electrode 118 respectively, and an electric field is generated between the first electrode 115 and the second electrode 118, so as to excite the light-emitting functional layer EL to emit light.

For example, the first electrode 115 may be an anode, and the second electrode 118 may be a cathode.

For example, a material of the second electrode 118 may include lithium, aluminum, magnesium, or silver.

It will be noted that, the display panel 100 may has a plurality of sub-pixel regions arranged in an array, each sub-pixel region is provided with a light-emitting device, and second electrodes 118 of all light-emitting devices are connected as a whole structure, that is, the second electrodes 118 are a lamellate electrode disposed on the display substrate 200 and serve as a common electrode of all light-emitting devices.

In some embodiments, as shown in FIG. 9, the display substrate 1 further includes a support layer 117 disposed on a side of the pixel defining layer 116 away from the substrate 10, and the support layer 117 may protect film layers located thereunder.

It will be noted that a protective film layer mainly appears in a process of transferring a semi-finished product, so as to avoid damage to the semi-finished product during the transfer process. For example, in a process of transferring the display substrate 1 in which the support layer 117 has been manufactured to an evaporation production line, the display substrate 1 may be covered with the protective film layer; and the protective film layer may be removed when the light-emitting material needs to be evaporated. In a process of manufacturing the light-emitting functional layer EL, the support layer 117 may prevent an equipment from contacting the first electrode 115 to cause damage to the first electrode 115. In a process of manufacturing the second electrode 118, the support layer 117 may prevent the equipment from contacting the light-emitting functional layer EL to affect a light-emitting effect of the light-emitting functional layer EL.

For example, the support layer 117 is made of a same material and disposed in a same layer as the pixel defining layer 116.

A structure of the blocking portion 3 will be described below.

In some embodiments, as shown in FIGS. 1 and 2, the display panel 100 further has a peripheral area BB surrounding the display area AA, the peripheral area BB includes a touch lead region FA on a side of the display area AA. The first barrier wall 2 and the blocking portion 3 are disposed in the peripheral area BB, and a portion of the blocking portion 3 located in the touch lead region FA is provided with an opening 32.

With the above arrangement of the blocking portion 3, in the process of ink-jet printing, in a case where the spray amount of ink is relatively large, the ink may preferentially overflow from the opening 32 of the blocking portion 3 in the touch lead region FA, and a flow direction of the ink may be controlled, so as to prevent the ink from overflowing a portion of the blocking portion 3 outside the touch lead region FA.

In some embodiments, as shown in FIGS. 1 and 2, the opening 32 of the blocking portion 3 is funnel-shaped. In the funnel-shaped opening 32, an end with a large size 32-1 is proximate to the display area AA, and an end with a small size 32-2 is proximate to a portion of the first barrier wall 2 located in the touch lead region FA.

By providing the opening 32 of the blocking portion 3 in the funnel shape, the opening 32 plays a role in guiding the ink, which is conducive to overflow of the ink from the opening 32. In addition, in the funnel-shaped opening 32, the end with a large size 32-1 is proximate to the display area AA, and the end with a small size 32-2 is proximate to the portion of the first barrier wall 2 located in the touch lead region FA, so that the ink flows from the end with a large size 32-1 to the end with a small size 32-2 of the opening 32, thereby playing a role in gathering the ink.

In some embodiments, as shown in FIGS. 1 and 2, the blocking portion 3 includes a main body portion 33 and two edges 34, the main body portion 33 is located in a region of the peripheral area BB other than the touch lead region FA, and at least a portion of each edge 34 is located in the touch lead region FA.

For example, as shown in FIG. 1, a portion of each edge 34 is located in the touch lead region FA, and the other portion of each edge 34 is located in the region of the peripheral area BB other than the touch lead region FA.

As shown in FIG. 1, the two edges 34 are respectively located on opposite sides of a center line L1 of the display substrate 1 extending in a first direction Y, and are respectively connected to both ends of the main body portion 33, and the opening 32 of the blocking portion 3 is formed between the two edges 34, so that the ink may overflow from the opening 32 between the two edges 34. The first direction Y is a direction substantially perpendicular to a boundary line L2 between display area AA and the touch lead region FA.

In some embodiments, as shown in FIGS. 1 and 2, each edge 34 includes a connection section 341 and a guide section 342, an end of the connection section 341 is connected to the main body portion 33, and the other end of the connection section 341 is connected to the guide section 342. In the two edges 34, a distance D1 between ends of the two guide sections 342 proximate to the connection sections 341 is greater than a distance D2 between ends of the two guide sections 342 away from the connection sections 341, that is, the two guide sections 342 are inclined, so that the two guide sections 342 play a role of guiding the ink, which is beneficial to the overflow of the ink from the opening 32, moreover, the two guide sections 342 play a role of gathering the ink.

In some embodiments, as shown in FIGS. 1 and 2, of the edge 34, the connection section 341 and the guide section 342 have a circular arc transition therebetween, so as to reduce a resistance to the ink at an connection between the connection section 341 and the guide section 342, which is beneficial for the ink to flow along the connection section 341 to the guide section 342.

In some embodiments, as shown in FIG. 2, the guide section 342 of the edge 34 and the portion of the first barrier wall 2 located in the touch lead region FA have a gap G therebetween. In a case where the spray amount of the ink is relatively large, the ink overflows from the gap G between the guide section 342 and the first barrier wall 2 through the opening 32 of the blocking portion 3, so as to control a flow direction of the ink, and prevent the ink from overflowing the portion of the blocking portion 3 outside the touch lead region FA.

For example, in the first direction Y, a distance of the gap G between the guide section 342 of the edge 34 and the portion of the first barrier wall 2 located in the touch lead region FA is in a range of 40 μm to 60 μm, inclusive. For example, the distance of the gap G is 40 μm, 45 μm, 50 μm, 55 μm or 60 μm.

In some embodiments, as shown in FIGS. 1 and 2, a ratio of a maximum dimension of the opening 32 of the blocking portion 3 in a second direction X (i.e. the distance D1 between the ends of the two guide sections 342 proximate to the connection sections 341) to a maximum dimension D3 of the portion of the first barrier wall 2 located in the touch lead region FA in the second direction X is greater than or equal to 0.5, and less than 1. For example, the ratio is 0.5, 0.6, 0.7, 0.8, 0.9, or 0.98. The second direction X is a direction substantially parallel to the boundary line L2 between display area AA and the touch lead region FA.

In some embodiments, as shown in FIG. 1, in a portion of the plurality of touch wires 5 in the touch lead region FA, at least some of the portion do not overlap with the blocking portion 3.

It will be noted that each touch wire 5 includes a lead section disposed in the touch lead region FA, and a wire section disposed in a region of the peripheral area BB other than the touch lead region FA. An end of the lead section is electrically connected to the wire section, and the other end of the lead section is electrically connected to a touch signal terminal.

It will be understood that a surface in a region of the display substrate 1 provided with the blocking portion 3 may be uneven, by making the at least some of the portion not overlap with the blocking portion 3, the film residue between the touch wires 5 caused by incomplete removal of the photoresist may be avoided during the process of manufacturing the touch wires 5 by adopting the photolithographic process, so as to avoid the short circuit of the touch wires 5.

For example, the entire portion of the touch wires 5 located in the touch lead region FA does not overlap with the blocking portion 3.

Another structure of the blocking portion 3 will be described below.

In some embodiments, as shown in FIG. 16, the blocking portion 3 is disposed around the display area AA, so that the ink for ink-jet printing flows in a region surrounded by the blocking portion 3, so as to prevent the ink from overflowing the blocking portion 3.

In some embodiments, as shown in FIGS. 4 and 9, the display panel 100 further includes a second encapsulation layer 7. The second encapsulation layer 7 is disposed between the display substrate 1 and the first encapsulation layer 4, and covers at least the display area AA, the blocking portion 3 and the first barrier wall 2.

With reference to FIG. 4, a surface, away from the display substrate 1, of a portion of the second encapsulation layer 7 covering the blocking portion 3 is substantially on a same plane as the second surface 42 of the first encapsulation layer 4. It will be understood that the ink just do not overflow the blocking portion 3, and covers the slope surface 31 of the blocking portion 3, so that the phenomenon that the ink climbs along the slope surface 31 of the blocking portion 3 is improved, and the flatness of the second surface 42 of the first encapsulation layer 4 is improved.

For example, the second encapsulation layer 7 is an inorganic barrier layer, which may block water vapor and air. For example, a material of the second encapsulation layer 7 may include silicon nitride, silicon oxide or silicon oxynitride.

In some embodiments, as shown in FIGS. 4 and 9, the display panel 100 further includes a third encapsulation layer 8. The third encapsulation layer 8 is disposed on a side of the first encapsulation layer 4 away from the display substrate 1, and covers at least the display area AA, the blocking portion 3 and the first barrier wall 2, and may block water vapor and air.

For example, the third encapsulation layer 8 is an inorganic barrier layer. For example, a material of the third encapsulation layer 8 may include silicon nitride, silicon oxide or silicon oxynitride.

In some embodiments, as shown in FIGS. 4 and 9, the display substrate 1 includes the substrate 10, and a plurality of first insulating layers that are stacked on the substrate 10. The plurality of first insulating layers include at least one of the aforementioned gate insulating layers (the first gate insulating layer 105 and the second gate insulating layer 107), the interlayer dielectric layer 109, the passivation layer 111, the first planarization layer 112, the second planarization layer 114, the pixel defining layer 116 and the support layer 117.

The blocking portion 3 and the first barrier wall 2 each includes a single sub-layer or a plurality of sub-layers that are stacked, and at least one sub-layer is located in at least one layer among the plurality of first insulating layers.

For example, as shown in FIG. 4, the blocking portion 3 includes two sub-layers 3a, 3b that are stacked, and one sub-layer 3a is disposed in the second planarization layer 114, and the other sub-layer 3b is disposed in the pixel defining layer 116.

For example, one sub-layer of the blocking portion 3 is disposed in the first planarization layer 112, and another sub-layer is disposed in the pixel defining layer 116.

For example, one sub-layer of the blocking portion 3 is disposed in the first planarization layer 112, and another sub-layer is disposed in the second planarization layer 114.

For example, as shown in FIG. 4, the first barrier wall 2 includes two sub-layers 2a, 2b that are stacked, one sub-layer 2a is disposed in the second planarization layer 114, and the other sub-layer 2b is disposed in the pixel defining layer 116.

For example, one sub-layer of the first barrier wall 2 is disposed in the first planarization layer 112, and another sub-layer is disposed in the pixel defining layer 116.

For example, one sub-layer of the first barrier wall 2 is disposed in the first planarization layer 112, and another sub-layer is disposed in the second planarization layer 114.

In some embodiments, as shown in FIG. 4, a maximum height of the blocking portion 3 is substantially equal to a maximum height of the first barrier wall 2.

It will be understood that, as shown in FIG. 4, of the blocking portion 3, the one sub-layer 3a is disposed in the second planarization layer 114, and the other sub-layer 3b is disposed in the pixel defining layer 116; of the first barrier wall 2, the one sub-layer 2a is disposed in the second planarization layer 114, and the other sub-layer 2b is disposed in the pixel defining layer 116. A film structure of the blocking portion 3 is the same as a film structure of the first barrier wall 2, therefore, the maximum height of the blocking portion 3 is substantially equal to the maximum height of the first barrier wall 2.

In some embodiments, as shown in FIGS. 3 and 4, the display panel 100 further includes a second barrier wall 9. The second barrier wall 9 is disposed on a side of the first barrier wall 2 away from display area AA, and around the display area AA for blocking the ink overflow.

As shown in FIG. 4, the second barrier wall 9 includes a single sub-layer or a plurality of sub-layers that are stacked, and at least one sub-layer is located in at least one layer among the plurality of first insulating layers. A maximum height of the second barrier wall 9 is greater than the maximum height of the first barrier wall 2, so that the second barrier wall 9 may block more ink and has a better blocking effect compared with the first barrier wall 2.

For example, the second barrier wall 9 includes three sub-layers 9a, 9b and 9c that are stacked, and the three sub-layers 9a, 9b and 9c are disposed in the first planarization layer 112, the second planarization layer 114, and the pixel defining layer 116, respectively.

It will be understood that, as shown in FIG. 4, of the first barrier wall 2, the one sub-layer 2a is disposed in the first planarization layer 114, and the other sub-layer 2b is disposed in the pixel defining layer 116; the three sub-layers 9a, 9b and 9c of the second barrier wall 9 are disposed in the first planarization layer 112, the second planarization layer 114 and the pixel defining layer 116, respectively. A number of film layers included in the second barrier wall 9 is more than a number of film layers included in the first barrier wall 2, therefore, the maximum height of the second barrier wall 9 is greater than the maximum height of the first barrier wall 2.

In some embodiments, as shown in FIGS. 1, 3 and 16, in the region of the peripheral area BB other than the touch lead region FA, in a direction of the plane where the display substrate 1 is located, a ratio of a distance D3-2 between the blocking portion 3 and the first barrier wall 2 to a distance D3-5 between the blocking portion 3 and the touch wire 5 farthest away from the display area AA among the plurality of touch wires 5 is less than or equal to 3. For example, the ratio is 3, 2.5, 2, 1.5 or 1.

In some embodiments, as shown in FIGS. 1, 3 and 16, in the region of the peripheral area BB other than the touch lead region FA, in the direction of the plane where the display substrate 1 is located, the distance D3-5 between the blocking portion 3 and the touch wire 5 farthest away from the display area AA among the plurality of touch wires 5 is in a range of 40 μm to 60 μm, inclusive. For example, the distance D3-5 is 40 μm, 46 μm, 50 μm, 58 μm or 60 μm.

In some embodiments, as shown in FIGS. 1, 3 and 16, in the region of the peripheral area BB other than the touch lead region FA, in the direction of the plane where the display substrate 1 is located, the distance D3-2 between the blocking portion 3 and the first barrier wall 2 is in a range of 140 μm to 160 μm, inclusive. For example, the distance D3-2 is 140 μm, 145 μm, 150 μm, 156 μm or 160 μm.

In some embodiments, as shown in FIGS. 1, 3 and 16, in the region of the peripheral area BB other than the touch lead region FA, in the direction of the plane where the display substrate 1 is located, the distance D3-5 between the blocking portion 3 and the touch wire 5 farthest away from the display area AA among the plurality of touch wires 5 is in a range of 40 μm to 60 μm, inclusive, and the distance D3-2 between the blocking portion 3 and the first barrier wall 2 is in a range of 140 μm to 160 μm, inclusive.

At present, the on cell technologies mainly include flexible multi-layer on cell (FMLOC) technology and flexible single-layer on cell (FSLOC) technology. The FMLOC technology is based on a working principle of mutual capacitance detection, and generally adopts two layers of metal to form touch driving electrodes (TX) and touch sensing electrodes (RX), and a touch action may be realized through detecting a mutual capacitance between a TX and an RX by an integrated circuit (IC). The FSLOC technology is based on a working principle of self-capacitance (or voltage) detection, and generally adopts a single layer of metal to form touch electrodes, and an touch action may be realized through detecting a self-capacitance (or voltage) of an electrode by an integrated circuit (IC).

The display panel 100 provided by some embodiments of the present disclosure will be described by considering an example where the display panel 100 adopts the FMLOC technology.

In some embodiments, as shown in FIG. 1, the display panel 100 further includes a touch functional layer TFL disposed on the display substrate 1. The touch functional layer TFL includes a plurality of first touch units T and a plurality of second touch units R. Each first touch unit T extends in the first direction Y, and the plurality of first touch units T are disposed side by side in the second direction X. Each second touch unit R extends in the second direction X, and the plurality of second touch units R are disposed side by side in the first direction Y. Each touch unit is electrically connected to at least one touch wire 5, and through the touch wire 5, a voltage signal is transmitted to the touch unit electrically connected thereto.

For example, as shown in FIG. 1, both ends of each first touch unit T are each electrically connected to a touch wire 5, and an end of each second touch unit R is electrically connected to another touch wire 5.

For example, both ends of each first touch unit T are each electrically connected to a touch wire 5, and both ends of each second touch unit R are each electrically connected to another touch wire 5.

As shown in FIG. 1, the first touch unit T includes a plurality of first touch electrodes T1 and a plurality of first connection portions T2. Two adjacent first touch electrodesT1 are electrically connected through a first connection portion T2 therebeween.

For example, the first touch electrodes T1 are touch driving electrodes.

As shown in FIG. 1, the second touch unit R includes a plurality of second touch electrodes R1 and a plurality of second connection portions R2. Two adjacent second touch electrodes R1 are electrically connected through a second connection portion R2 therebeween.

For example, the second touch electrodes R1 are touch sensing electrodes.

Through the above-mentioned arrangement, a first touch electrode T1 and a second touch electrode R1 may provide a mutual capacitance therebetween, and a value of the mutual capacitance between those touch electrodes corresponding to a touch position will changes after the display panel 100 is touched, so that the touch position may be determined by detecting a change amount of the value of the mutual capacitance.

In some embodiments, as shown in FIG. 9, the touch functional layer TFL includes an electrode layer 201, a second insulating layer 202, and a bridge layer 203 that are stacked on the display substrate 1. The second insulating layer 202 is located between the electrode layer 201 and the bridge layer 203, and the bridge layer 203 is located on a side of the electrode layer 201 away from the display substrate 1.

The plurality of first touch electrodes T1, the plurality of second touch electrodes R1 and the plurality of second connection portions R2 are disposed in the electrode layer 201. That is, the first touch electrodes T1, the second touch electrodes R1 and the second connection portions R2 are disposed in the same layer. The plurality of first connection portions T2 are disposed in the bridge layer 203.

In the first direction Y, a first connection portion T2 passes through different via holes 202A in the second insulating layer 202 and are electrically connected to two adjacent first touch electrodes T1. In the second direction X, every two adjacent second touch electrodes R1 are directly electrically connected through a second connection portion R2 therebetween.

Figure 10:
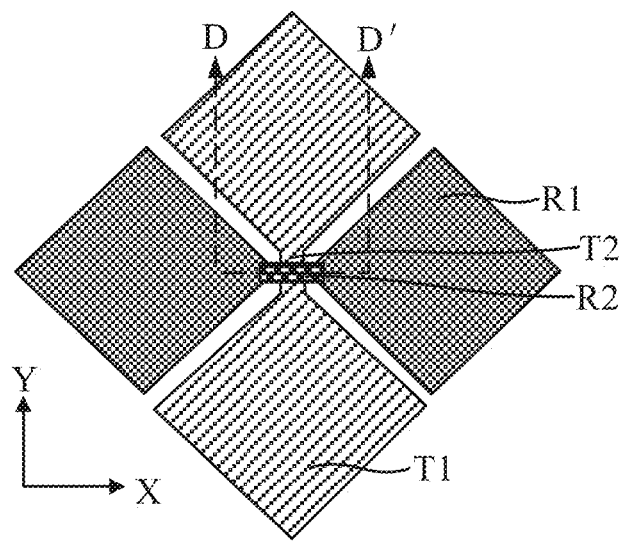
FIG. 10 is a structural diagram of yet another display panel, in accordance with some embodiments of the present disclosure.
Figure 11:
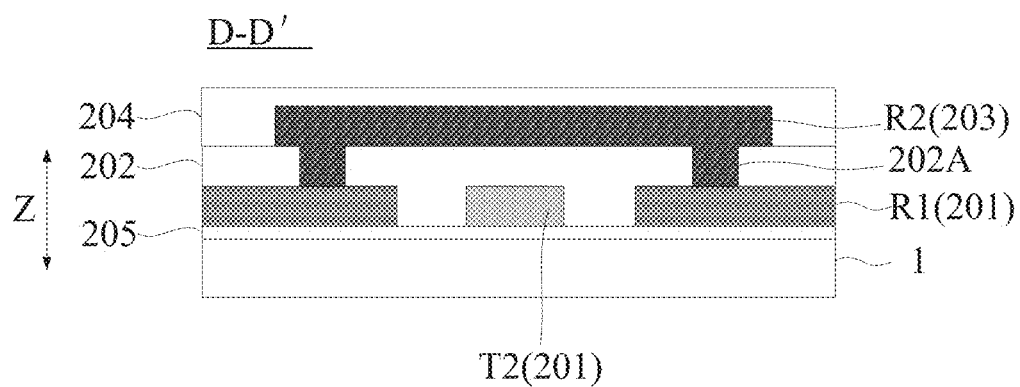
FIG. 11 is a cross-sectional view of the display panel shown in FIG. 10 taken along the line D-D'.

In some embodiments, as shown in FIGS. 10 and 11, the plurality of first touch electrodes T1, the plurality of first connection portions T2 and the plurality of second touch electrodes R1 are disposed in the electrode layer 201. That is, the first touch electrodes T1, the first connection portions T2 and the second touch electrodes R1 are disposed in the same layer. The plurality of second connection portions T2 are disposed in the bridge layer 203.

In the second direction T1, every two adjacent first touch electrodes T1 are directly electrically connected through a first connection portion T1 therebetween. In the second direction X, a second connection portion R2 passes through different via holes 202A in the second insulating layer 202 and are electrically connected to two adjacent second touch electrodes R1.

Figure 12:
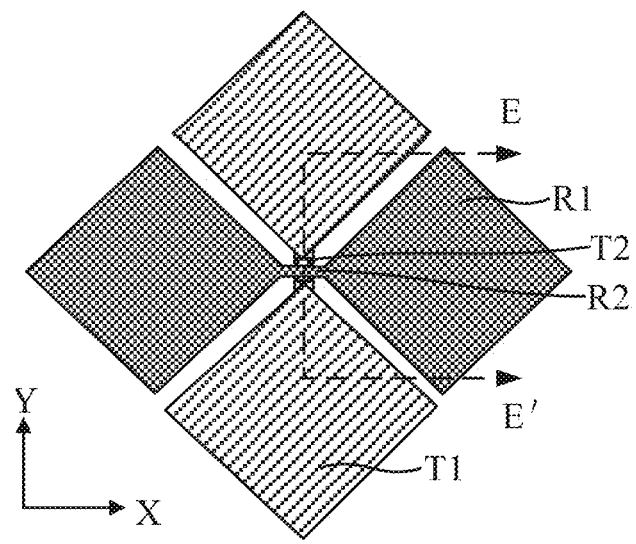
FIG. 12 is a structural diagram of yet another display panel, in accordance with some embodiments of the present disclosure.
Figure 13:
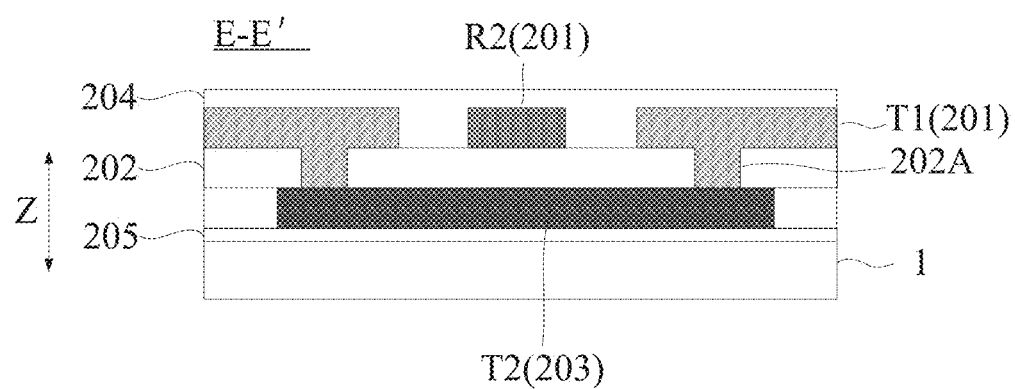
FIG. 13 is a cross-sectional view of the display panel shown in FIG. 12 taken along the line E-E'.

In some other embodiments, as shown in FIGS. 12 and 13, the display panel 100 includes the electrode layer 201, the second insulating layer 202 and the bridge layer 203 that are stacked on the display substrate 1. The electrode layer 201 is located on a side of the bridge layer 203 away from the display substrate 1, the second insulating layer 202 is located between the electrode layer 201 and the bridge layer 203, and the second insulating layer 202 is provided with a plurality of via holes 202A therein.

The plurality of first touch electrodes T1, the plurality of second touch electrodes R1 and the plurality of second connection portions R2 are disposed in the electrode layer 201. That is, the first touch electrodes T1, the second touch electrodes R1 and the second connection portions R2 are disposed in the same layer. The plurality of first connection portions T2 are disposed in the bridge layer 203.

In the first direction Y, two adjacent first touch electrodes T1 are electrically connected to a first connection portion T2 through different via holes 202A in the second insulating layer 202, respectively. In the second direction X, two adjacent second touch electrodes R1 are directly electrically connected through a second connection portion R2 therebetween.

Figure 14:
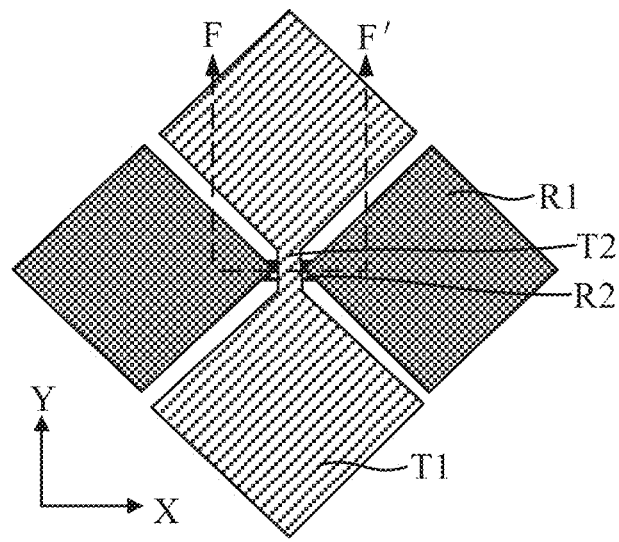
FIG. 14 is a structural diagram of yet another display panel, in accordance with some embodiments of the present disclosure.
Figure 15:
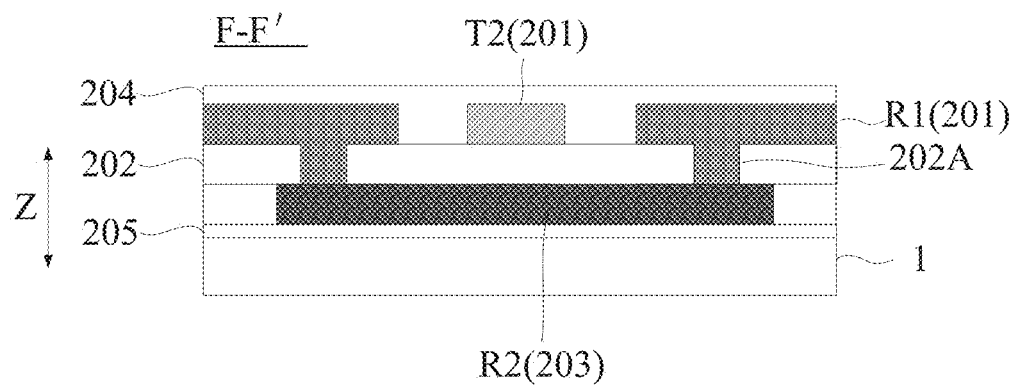
FIG. 15 is a cross-sectional view of the display panel shown in FIG. 14 taken along the line F-F'.

In some other embodiments, as shown in FIGS. 14 and 15, the plurality of first touch electrodes T1, the plurality of second touch electrodes R1 and the plurality of first connection portions T2 are disposed in the electrode layer 201. That is, the first touch electrodes T1, the second touch electrodes R1 and the first connection portions T2 are disposed in the same layer. The plurality of second connection portions R2 are disposed in the bridge layer 203.

In the first direction Y, two adjacent first touch electrodes T1 are directly electrically connected through a first connection portion T2 therebetween. In the second direction X, two adjacent second touch electrodes R1 are electrically connected to a second connection portion R2 through different via holes 202A in the second insulating layer 202, respectively.

In some embodiments, as shown in FIG. 7, the touch wire 5 includes a first touch sub-wire 51 disposed in the electrode layer 201 and a second touch sub-wire 52 disposed in the bridge layer 203. The first touch sub-wire 51 and the second touch sub-wire 52 are electrically connected through at least one via hole 202A in the second insulating layer 202. By connecting the first touch sub-wire 51 in parallel with the second touch sub-wire 52, an impedance of the touch wire 5 may be reduced, and in turn, a voltage drop in transmission of a voltage signal by the touch wire 5 is reduced.

In some embodiments, as shown in FIGS. 7 and 9, the touch functional layer TFL further includes a first protective layer 205 disposed between the display substrate 1 and the electrode layer 201, and the first protective layer 205 plays a role of protecting the display substrate 1.

For example, a material of the first protective layer 205 may include an inorganic material. For example, the material of the first protective layer 205 may include silicon nitride, silicon oxide, or silicon oxynitride.

In some embodiments, as shown in FIGS. 7 to 9, the touch functional layer TFL may further include a second protective layer 204 disposed on a side of the bridge layer 203 away from the display substrate 1, and the second protective layer 204 plays a role of protecting the touch units and the touch wires 5.

For example, a material of the second protective layer 204 may include an organic material. For example, the material of the second protective layer 204 may include polyimide.

In some embodiments, as shown in FIG. 3, the plurality of first touch electrodes T1 and the plurality of second touch electrodes R1 are each of a metal mesh structure. Touch electrodes with the metal mesh structure have low resistance and high sensitivity, so that touch sensitivity of the display panel 100 is improved. Moreover, the touch electrodes with the metal mesh structure have high mechanical strength, so that a weight of the touch panel 100 may be reduced, therefor, a weight of a display apparatus having the display panel 100 is reduced.

In some embodiments, as shown in FIG. 3, the display panel 100 further includes at least one shielding wire L located on the side of the plurality of touch wires 5 away from the display area AA. An orthographic projection of the shielding wire L on the display substrate 1 is non-overlapping with the orthographic projection of the blocking portion 3 on the display substrate 1, and is located a region between the orthographic projection of the transition surface 43 on the display substrate 1 and the orthographic projection of the touch wire 5 farthest away from the display area AA among the plurality of touch wires 5 on the display substrate 1.

Through the above-mentioned arrangement, the second surface 42 of the first encapsulation layer 4 may cover a region of the display substrate 1 corresponding to the shielding wire L, so that flatness of a surface of the display substrate 1 in this region is improved. In a process of manufacturing the shielding wire L by adopting a photolithographic process, it is possible to avoid film residue between the shielding wire L and the touch wires 5 due to incomplete removal of photoresist, so as to avoid short circuit between the shielding wire L and the touch wires 5.

In some embodiments, the shielding wire L may be a ground wire (GND), which is used to transmit a ground voltage signal. Alternatively, the shielding wire L may be a panel crack detection (PCD) wire, which is used to transmit a detection voltage signal. Alternatively, the shielding wire L may be a guard wire, which is used to shield interference between signals.

In some embodiments, as shown in FIGS. 3 and 4, on the display substrate 1, the orthographic projection of the touch wire 5 farthest away from the display area AA among the plurality of touch wires 5 and the orthographic projection of the first encapsulation layer 4 have an overlap therebetween, and a portion of the first encapsulation layer 4 located at a position of the overlap is a first portion; and on the display substrate 1, the orthographic projection of the shielding wire L and the orthographic projection of the first encapsulation layer 4 have another overlap therebetween, and a portion of the first encapsulation layer 4 located at a position of the another overlap is a second portion. A minimum thickness of the first portion is greater than or equal to a maximum thickness of the second portion.

It will be understood that, as shown in FIG. 3, the shielding wire L is located on the side of the plurality of touch wires 5 away from the display area AA. That is, the shielding wire L is closer to an edge region of the first encapsulation layer 4 than the plurality of touch wires 5.

For example, in a case where a middle region of the first encapsulation layer 4 is thick and the edge region of the first encapsulation layer 4 is thin, the minimum thickness of the first portion of the first encapsulation layer 4 is greater than the maximum thickness of the second portion of the first encapsulation layer 4.

For example, in a case where a thickness of each region of the first encapsulation layer 4 is approximately the same, the minimum thickness of the first portion of the first encapsulation layer 4 is equal to the maximum thickness of the second portion of the first encapsulation layer 4.

In some embodiments, of the first encapsulation layer 4, a ratio of a difference between the minimum thickness of the first portion and the maximum thickness of the second portion to the minimum thickness of the first portion is within 30%.

For example, the ratio is within 30%, the ratio is within 25%, the ratio is within 20%, or the ratio is within 10%.

For example, the ratio is 0, that is, of the first encapsulation layer 4, the minimum thickness of the first portion is approximately equal to the maximum thickness of the second portion.

Figure 17:
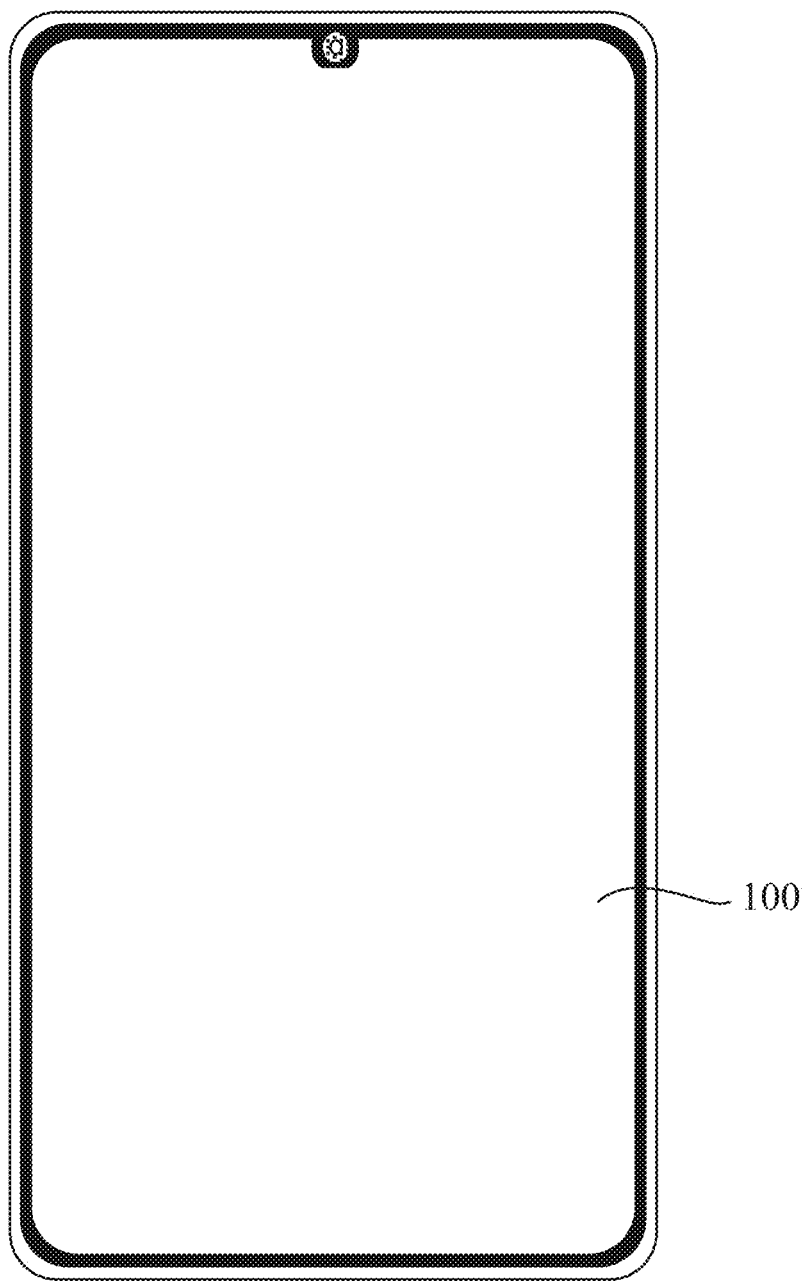
FIG. 17 is a structural diagram of a display apparatus, in accordance with some embodiments of the present disclosure.

Some embodiments of the present disclosure provide a display apparatus, as shown in FIG. 17, the display apparatus 200 includes the display panel 100 in any one of the above embodiments.

In the display apparatus 200 in the above-mentioned embodiments of the present disclosure, the at least a portion of the orthographic projection of the transition surface 43 of the first encapsulation layer 4 of the display panel 100 on the display substrate 1 is located in the region between the border, proximate to the display area AA, of the orthographic projection of the blocking portion 3 on the display substrate 1 and the orthographic projection of the touch wire 5 farthest away from the display area AA among the plurality of touch wires 5 on the display substrate 1, so that the second surface 42 of the first encapsulation layer 4 is flatter than the transition surface 43 of the first encapsulation layer 4. And the plurality of touch wires 5 are disposed on the side of the first encapsulation layer 4 away from the display substrate 1 (the second surface 42 of the first encapsulation layer 4), so that the plurality of touch wires 5 are avoided being provided on the transition surface 43 of the first encapsulation layer 4, which is beneficial to control the critical dimension bias (CD bias) of the touch wires 5.

In addition, the first encapsulation layer 4 may cover the region of the display substrate 1 corresponding to the touch wires 5, so that the flatness of the surface of the display substrate 1 in the region is improved. In the process of manufacturing the touch wires 5 by adopting the photolithographic process, the film residue between the touch wires 5 due to the incomplete removal of the photoresist may be avoided, so as to avoid the short circuit of the touch wires 5.

The display apparatus 200 may be an electroluminescent display apparatus, and the electroluminescent display apparatus may be an organic light-emitting diode (OLED) display apparatus or a quantum dot light-emitting diode (QLED) display apparatus.

The display apparatus 200 may be any apparatus that displays an image whether in motion (e.g., a video) or stationary (e.g., a still image), and whether textual or graphical. More specifically, it is anticipated that the embodiments may be implemented in a variety of electronic apparatuses or associated with a variety of electronic apparatuses. The variety of electronic apparatuses include (but are not limited to): mobile phones, wireless apparatuses, personal data assistants (PDAs), hand-held or portable computers, global position system (GPS) receivers/navigators, cameras, mpeg-4 part 14 (MP4) video players, video cameras, game consoles, watches, clocks, calculators, television monitors, flat panel displays, computer monitors, automobile displays (e.g., odometer displays, etc.), navigators, cockpit controllers and/or displays, displays with camera views (e.g., displays of rear-view cameras in vehicles), electronic photos, electronic billboards or signs, projectors, building structures, packaging and aesthetic structures (e.g., displays for displaying an image of a piece of jewelry), etc.

Figure 18:
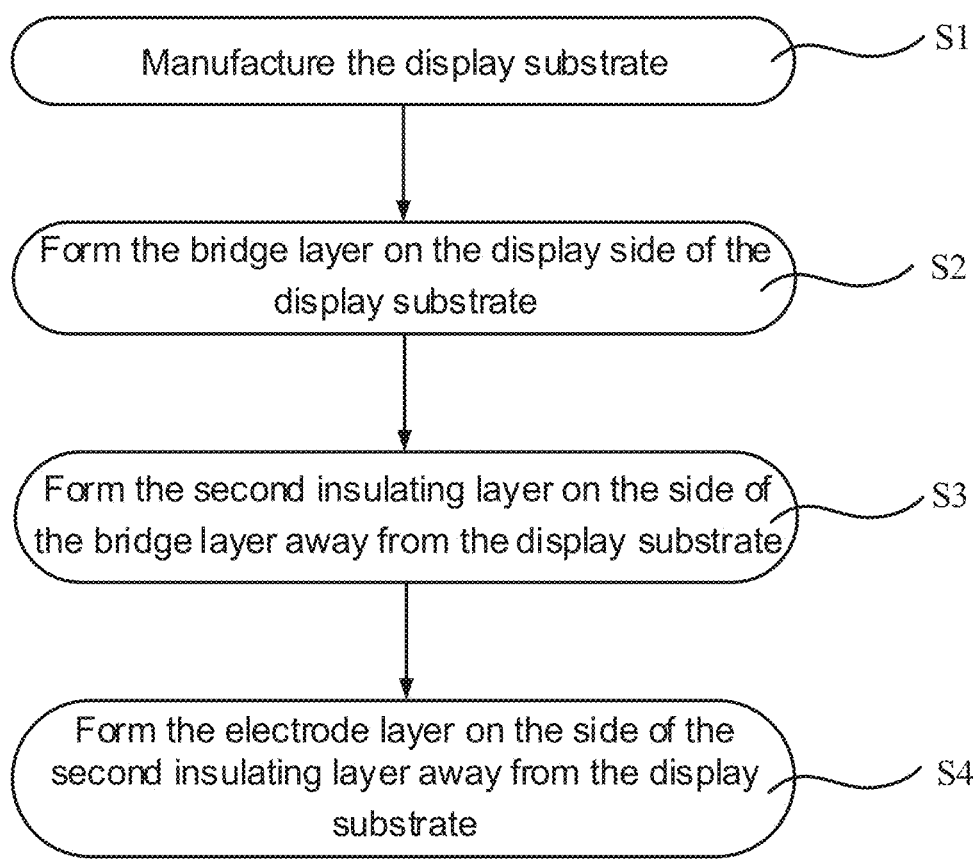
FIG. 18 is a flow diagram of a manufacturing method for a display panel, in accordance with some embodiments of the present disclosure.

Some embodiments of the present disclosure provide a method for manufacturing the display panel. As shown in FIG. 18, the manufacturing method includes step 1 to step 4 (S1 to S4).

In S1, the display substrate 1 is manufactured.

Figure 20:
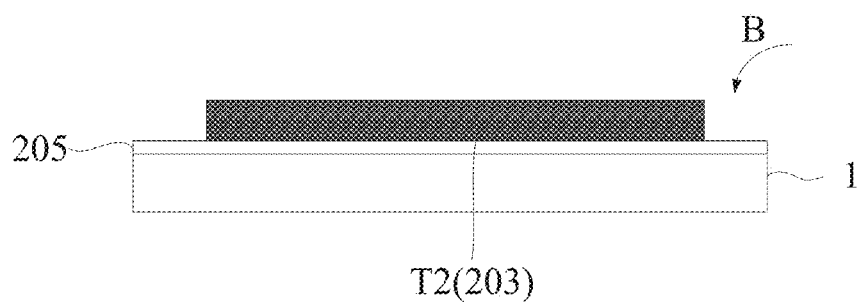
FIGS. 20 to 23 are diagrams of steps of a manufacturing method for a display panel, in accordance with some embodiments of the present disclosure.

In S2, as shown in FIG. 20, the bridge layer 203 is formed on the display side B of the display substrate 1.

For example, a bridge metal layer is formed on the display side B of the display substrate 1, a photoresist pattern is formed on a side of the bridge metal layer away from the display substrate 1 by an exposure and development process, and the bridge metal layer is etched using the photoresist pattern as a mask to form the bridge layer 203.

For example, the bridge layer 203 is provided with the first connection portions T2, and the second touch sub-wires 52 of the touch wires 5 therein.

For example, the bridge layer 203 is of a laminated structure including titanium, aluminum and titanium that are stacked.

Figure 21:
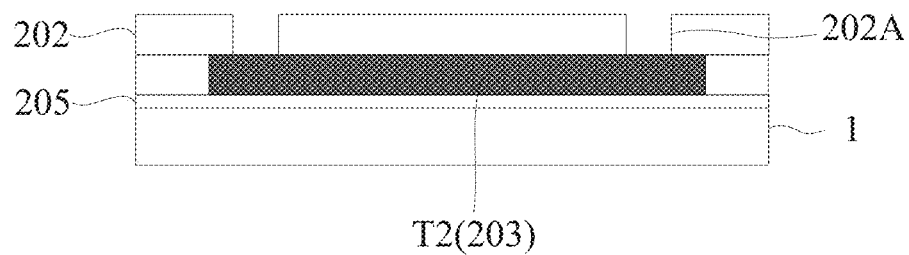

In S3, as shown in FIG. 21, the second insulating layer 202 is formed on the side of the bridge layer 203 away from the display substrate 1.

For example, an insulating film is formed on the side of the bridge layer 203 away from the display substrate 1, and an exposure and development process is used to form a photoresist pattern on the side of the insulating film away from the display substrate 1, and the plurality of via holes 202A are etched in the insulating film using the photoresist pattern as a mask, so as to form the second insulating layer 202.

Figure 22:
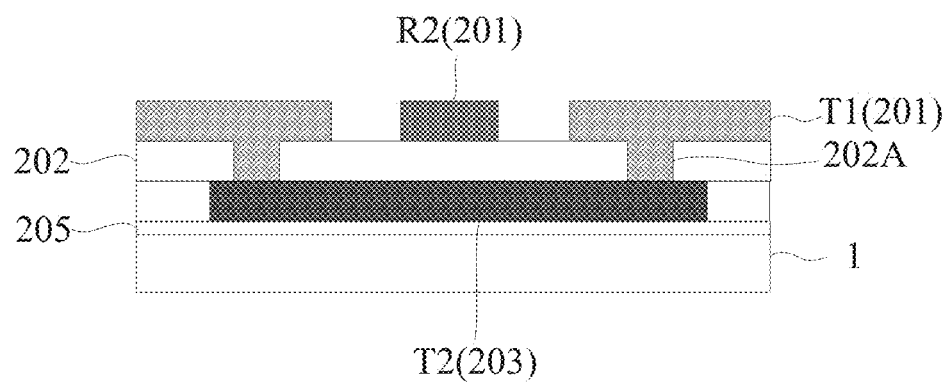

In S4, as shown in FIG. 22, the electrode layer 201 is formed on the side of the second insulating layer 202 away from the display substrate 1.

For example, an electrode metal layer is formed on the side of the second insulating layer 202 away from the display substrate 1, and an exposure and development process is used to form a photoresist pattern on the side of the electrode metal layer away from the display substrate 1, and the electrode metal layer is etched using the photoresist pattern as a mask to form the electrode layer 201.

For example, the electrode layer 201 is provided with the first touch electrodes T1, the second touch electrodes R1, the second connection portions R2, and the first touch sub-wires 51 of the touch wires 5 therein.

For example, the electrode layer 201 is of a laminated structure including titanium, aluminum and titanium that are stacked.

Figure 19:
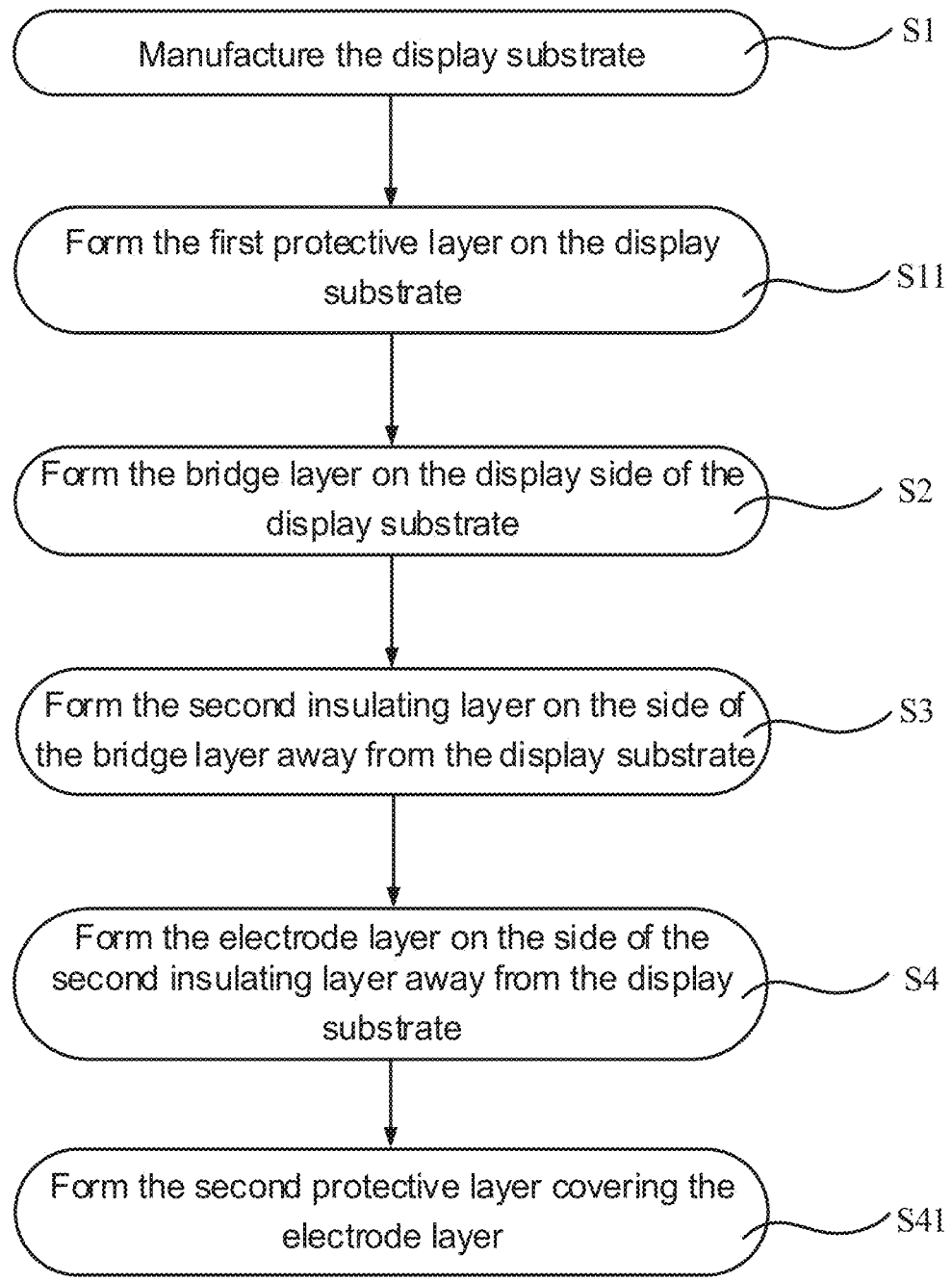
FIG. 19 is a flow diagram of a manufacturing method for another display panel, in accordance with some embodiments of the present disclosure.

In some embodiments, as shown in FIG. 19, before S2, the manufacturing method further includes step 11 (S11).

In S11, as shown in FIG. 20, the first protective layer 205 is formed on the display substrate 1.

For example, a chemical vapor deposition (CVD) process may be used to form the first protective layer 205 on the display substrate 1.

For example, a material of the first protective layer 205 may include an inorganic material. For example, the material of the first protective layer 205 may include silicon nitride, silicon oxide, or silicon oxynitride.

In some embodiments, as shown in FIG. 19, after S4, the manufacturing method further includes step 41 (S41).

Figure 23:
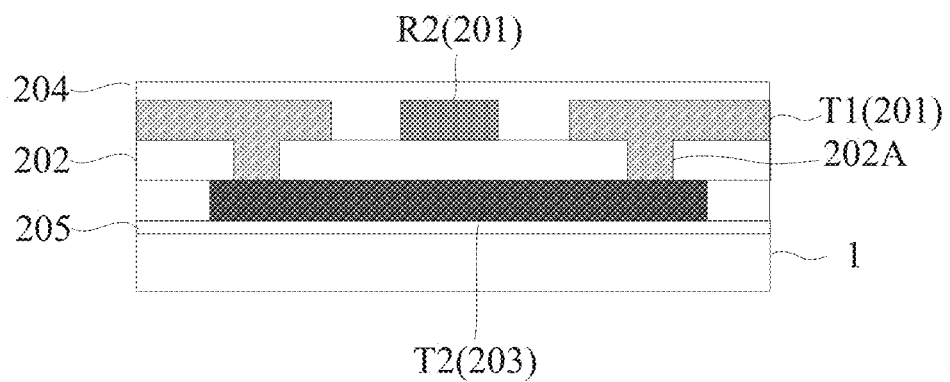

In S41, as shown in FIG. 23, the second protective layer 204 covering the electrode layer 201 is formed.

For example, the second protective layer 204 is formed using a photolithographic process.

For example, a material of the second protective layer 204 may include an organic material. For example, the material of the second protective layer 204 may include polyimide.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A display panel having a display area, comprising:
   a display substrate;
   a first barrier wall disposed on a display side of the display substrate and surrounding the display area;
   a blocking portion disposed between the first barrier wall and the display area, the blocking portion at least partially surrounding the display area;
   a first encapsulation layer covering at least the display area, the first encapsulation layer including a first surface proximate to the display substrate, a second surface away from the display substrate, and a transition surface connecting the first surface and the second surface; and
   a plurality of touch wires disposed on a side of the first encapsulation layer away from the display substrate; orthographic projections of the plurality of touch wires on the display substrate at least partially overlapping with an orthographic projection of the second surface on the display substrate, and being staggered with an orthographic projection of the transition surface on the display substrate;
   wherein at least a portion of the orthographic projection of the transition surface on the display substrate is located in a region between a border, away from the display area, of an orthographic projection of the blocking portion on the display substrate and an orthographic projection of a touch wire farthest away from the display area among the plurality of touch wires on the display substrate.

2. The display panel according to claim 1, wherein at least a portion of a border, proximate to the display area, of the orthographic projection of the blocking portion on the display substrate is located within a range of the orthographic projection of the transition surface on the display substrate;
   at least a portion of a border of an orthographic projection of the first surface on the display substrate is located within a region between the border, proximate to the display area, of the orthographic projection of the blocking portion on the display substrate and the orthographic projection of the touch wire farthest away from the display area among the plurality of touch wires on the display substrate; and
   at least a portion of a border of the orthographic projection of the second surface on the display substrate is located within a region between the border, proximate to the display area, of the orthographic projection of the blocking portion on the display substrate and the border, away from the display area, of the orthographic projection of the blocking portion on the display substrate.

3. The display panel according to claim 1, wherein an edge portion of the blocking portion proximate to the display area includes a slope surface, and an edge portion of the first encapsulation layer proximate to the blocking portion climbs along the slope surface; or
   wherein an edge portion of the blocking portion proximate to the display area includes a slope surface, and an edge portion of the first encapsulation layer proximate to the blocking portion climbs along the slope surface, wherein the transition surface is an arc-shaped surface, and a shape of the arc-shaped surface is adapted to a shape of the slope surface.

4. The display panel according to claim 1, wherein at least a portion of a border of an orthographic projection of the first surface on the display substrate, and at least a portion of a border of the orthographic projection of the second surface on the display substrate are both located within a region between a border, proximate to the display area, of the orthographic projection of the blocking portion on the display substrate and the orthographic projection of the touch wire farthest away from the display area among the plurality of touch wires on the display substrate, and/or
wherein the transition surface is substantially perpendicular to a plane where the display substrate is located, or the transition surface is an arc-shaped surface bent toward an inside of the first encapsulation layer.

5. The display panel according to claim 1, wherein the display substrate includes:
a substrate; and
at least one planarization layer disposed on the substrate;
wherein the display substrate has a groove located between the blocking portion and the display area, the groove at least partially surrounds the display area, and the groove at least partially penetrates the at least one planarization layer in a thickness direction of the display substrate; and
an orthographic projection of at least one touch wire among the plurality of touch wires on the display substrate at least partially overlaps with a region where the groove is located.

6. The display panel according to claim 5, wherein the at least one planarization layer includes:
a first planarization layer disposed on the substrate; and
a second planarization layer disposed on a side of the first planarization layer away from the substrate;
wherein the groove at least partially penetrates at least one of the first planarization layer or the second planarization layer, and/or
wherein the first encapsulation layer includes:
a filling portion filling the groove; and
a covering portion located in at least a portion of a region of the display substrate other than the groove;
wherein a surface of the filling portion away from the display substrate is substantially coplanar with a surface of the covering portion away from the display substrate.

7. The display panel according to claim 1, wherein the display panel further has a peripheral area surrounding the display area, the peripheral area includes a touch lead region located on a side of the display area; and
the first barrier wall, the blocking portion and the plurality of touch wires are disposed in the peripheral area, and a portion of the blocking portion located in the touch lead region has an opening; or the first barrier wall, the blocking portion and the plurality of touch wires are disposed in the peripheral area, and a portion of the blocking portion located in the touch lead region has an opening, the opening is funnel-shaped, and in the funnel-shaped opening, an end with a large size is proximate to the display area, and an end with a small size is proximate to a portion of the first barrier wall located in the touch lead region.

8. The display panel according to claim 7, wherein the blocking portion includes:
a main body portion located in a region of the peripheral area other than the touch lead region; and
two edges, at least a portion of each edge being located in the touch lead region; the two edges being respectively located on opposite sides of a center line of the display substrate extending in a first direction, and being respectively connected to both ends of the main body portion; the opening being formed between the two edges; and the first direction being a direction substantially perpendicular to a boundary line between the display area and the touch lead region.

9. The display panel according to claim 8, wherein each edge includes a connection section and a guide section, of the connection section, one end is connected to the main body portion, and another end is connected to the guide section; and
in the two edges, a distance between ends of the two guide sections proximate to the connection sections is greater than a distance between ends of the two guide sections away from the connection sections.

10. The display panel according to claim 9, wherein the connection section and the guide section have a circular arc transition therebetween; and/or
wherein the guide section and the portion of the first barrier wall located in the touch lead region have a gap therebetween.

11. The display panel according to claim 8, wherein a ratio of a maximum dimension of the opening in a second direction to a maximum dimension of the portion of the first barrier wall located in the touch lead region in the second direction is greater than or equal to 0.5, and less than 1, the second direction is a direction substantially parallel to the boundary line between the display area and the touch lead region.

12. The display panel according to claim 1, further comprising:
a second encapsulation layer disposed between the display substrate and the first encapsulation layer, the second encapsulation layer covering at least the display area, the blocking portion and the first barrier wall, and
a surface, away from the display substrate, of a portion of the second encapsulation layer covering the blocking portion is substantially coplanar with the second surface of the first encapsulation layer.

13. The display panel according to claim 1, wherein the display substrate includes:
a substrate; and
a plurality of first insulating layers stacked on the substrate, the plurality of first insulating layers including at least one of a gate insulating layer, an interlayer dielectric layer, a passivation layer, a first planarization layer, a second planarization layer, a pixel defining layer or a support layer;
wherein the blocking portion and the first barrier wall each includes a single sub-layer or a plurality of sub-layers that are stacked, at least one sub-layer is located in at least one layer among the plurality of first insulating layers; or wherein the blocking portion and the first barrier wall each includes a single sub-layer or a plurality of sub-layers that are stacked, at least one sub-layer is located in at least one layer among the plurality of first insulating layers, and a maximum height of the blocking portion is substantially equal to a maximum height of the first barrier wall.

14. The display panel according to claim 13, further comprising:
a second barrier wall disposed on a side of the first barrier wall away from the display area and surrounding the display area;

wherein the second barrier wall includes another single sub-layer or another plurality of sub-layers that are stacked, at least one sub-layer of the second barrier wall is located in the at least one layer or located in another at least one layer among the plurality of first insulating layers; and a maximum height of the second barrier wall is greater than a maximum height of the first barrier wall.

15. The display panel according to claim 1, wherein the display panel further has a peripheral area surrounding the display area, the peripheral area includes a touch lead region located on a side of the display area; and the first barrier wall, the blocking portion and the plurality of touch wires are disposed in the peripheral area;

in a region of the peripheral area other than the touch lead region, in a direction of a plane where the display substrate is located, a ratio of a distance between the blocking portion and the first barrier wall to a distance between the blocking portion and the touch wire farthest away from the display area among the plurality of touch wires is less than or equal to 3; or in a region of the peripheral area other than the touch lead region, in a direction of a plane where the display substrate is located, a ratio of a distance between the blocking portion and the first barrier wall to a distance between the blocking portion and the touch wire farthest away from the display area among the plurality of touch wires is less than or equal to 3, the distance between the blocking portion and the touch wire farthest away from the display area among the plurality of touch wires is in a range of 40 μm to 60 μm, inclusive, and/or the distance between the blocking portion and the first barrier wall is in a range of 140 μm to 160 μm, inclusive.

16. The display panel according to claim 1, further comprising:

a touch functional layer disposed on the display substrate, the touch functional layer including:

an electrode layer, a second insulating layer, and a bridge layer that are stacked on the display substrate, the second insulating layer being located between the electrode layer and the bridge layer, and the bridge layer being located on a side of the electrode layer proximate to or away from the display substrate, wherein the electrode layer and the bridge layer are divided into at least a plurality of first touch units and a plurality of second touch units; each first touch unit extends in a first direction, and the plurality of first touch units are arranged side by side in a second direction; each second touch unit extends in the second direction, and the plurality of second touch units are arranged side by side in the first direction, the first direction crosses the second direction; and each of the pluralities of first touch units and second touch units is electrically connected to at least one touch wire;

the first touch unit includes a plurality of first touch electrodes and a plurality of first connection portions, two adjacent first touch electrodes are electrically connected through a first connection portion therebetween; and the second touch unit includes a plurality of second touch electrodes and a plurality of second connection portions, two adjacent second touch electrodes are electrically connected through a second connection portion therebetween;

wherein the first touch electrodes, the first connection portions and the second touch electrodes are disposed in the electrode layer, and the second connection portions are disposed in the bridge layer; or the first touch electrodes, the second touch electrodes and the second connection portions are disposed in the electrode layer, and the first connection portions are disposed in the bridge layer.

17. The display panel according to claim 16, wherein at least one touch wire among the plurality of touch wires includes a first touch sub-wire disposed in the electrode layer and a second touch sub-wire disposed in the bridge layer, the first touch sub-wire is electrically connected to the second touch sub-wire through at least one via hole in the second insulating layer, and/or wherein the first touch electrodes and the second touch electrodes are each of a metal mesh structure.

18. The display panel according to claim 1, further comprising at least one shielding wire located on a side of the plurality of touch wires away from the display area, an orthographic projection of the shielding wire on the display substrate being non-overlapping with the orthographic projection of the blocking portion on the display substrate, and the orthographic projection of the shielding wire on the display substrate being located in a region between the orthographic projection of the transition surface on the display substrate and the orthographic projection of the touch wire farthest from the display area among the plurality of touch wires on the display substrate.

19. The display panel according to claim 18, wherein a minimum thickness of the first encapsulation layer at an overlapping position of the touch wire farthest away from the display area among the plurality of touch wires and the first encapsulation layer is greater than or equal to a maximum thickness of the first encapsulation layer at an overlapping position of the shielding wire and the first encapsulation layer; or wherein a minimum thickness of the first encapsulation layer at an overlapping position of the touch wire farthest away from the display area among the plurality of touch wires and the first encapsulation layer is greater than or equal to a maximum thickness of the first encapsulation layer at an overlapping position of the shielding wire and the first encapsulation layer; and a ratio of a difference between the minimum thickness and the maximum thickness to the minimum thickness is within 30%.

20. A display apparatus, comprising the display panel according to claim 1.

* * * * *